US008132083B1

(12) United States Patent
Au et al.

(10) Patent No.: US 8,132,083 B1
(45) Date of Patent: Mar. 6, 2012

(54) ARCHITECTURE AND CONTROL OF REED-SOLOMON LIST DECODING

(75) Inventors: Siu-Hung Fred Au, Fremont, CA (US); Gregory Burd, San Jose, CA (US); Zining Wu, Los Altos, CA (US); Jun Xu, Sunnyvale, CA (US); Ichiro Kikuchi, Yokohama (JP); Tony Yoon, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 360 days.

(21) Appl. No.: 12/541,720

(22) Filed: Aug. 14, 2009

Related U.S. Application Data

(62) Division of application No. 12/256,652, filed on Oct. 23, 2008, now Pat. No. 7,590,924, which is a division of application No. 11/195,183, filed on Aug. 1, 2005, now Pat. No. 7,454,690.

(60) Provisional application No. 60/680,969, filed on May 12, 2005, provisional application No. 60/622,429, filed on Oct. 27, 2004.

(51) Int. Cl.
H03M 13/00 (2006.01)
(52) U.S. Cl. ......................................... 714/784; 714/785
(58) Field of Classification Search .................. 714/784, 714/785
See application file for complete search history.

(56) References Cited

U.S. PATENT DOCUMENTS

| 4,541,092 | A | | 9/1985 | Sako et al. |
|---|---|---|---|---|
| 5,226,043 | A | | 7/1993 | Pughe, Jr. et al. |
| 5,373,511 | A | | 12/1994 | Veksler |
| 5,450,421 | A | | 9/1995 | Joo et al. |
| 5,452,310 | A | | 9/1995 | Arts |
| 5,732,093 | A | | 3/1998 | Huang |
| 6,131,178 | A | * | 10/2000 | Fujita et al. .................... 714/784 |
| 6,260,173 | B1 | * | 7/2001 | Weng et al. .................... 714/781 |
| 6,275,965 | B1 | | 8/2001 | Cox et al. |
| 6,446,234 | B1 | * | 9/2002 | Cox et al. ....................... 714/758 |
| 6,634,007 | B1 | * | 10/2003 | Koetter et al. ................ 714/784 |
| 6,961,197 | B1 | | 11/2005 | Burd |
| 7,099,411 | B1 | | 8/2006 | Wu |
| 7,120,850 | B2 | | 10/2006 | Lehobey et al. |
| 7,131,052 | B2 | | 10/2006 | Hassner et al. |
| 7,185,259 | B2 | | 2/2007 | Fujita et al. |
| 7,444,582 | B1 | | 10/2008 | Au et al. |
| 2005/0185729 | A1 | | 8/2005 | Mills |
| 2006/0059409 | A1 | | 3/2006 | Lee |

OTHER PUBLICATIONS

U.S. Appl. No. 10/313,651 filed Dec. 6, 2002.
U.S. Appl. No. 11/195,403 filed Aug. 1, 2005.
R. Blahut, *Theory and Practice of Error Control Codes*, p. 267-272, 1983.
D. Chase, "A Class of Algorithms for Decoding Block Codes with Channel Measurement Information," *IEEE Trans. Infor. Theory*, vol. IT-18, No. 1, Jan. 1972, pp. 170-182.

(Continued)

*Primary Examiner* — M. Mujtaba K Chaudry

(57) ABSTRACT

Systems and methods are provided for implementing list decoding in a Reed-Solomon (RS) error-correction system. A detector can provide a decision-codeword from a channel and can also provide soft-information for the decision-codeword. The soft-information can be organized into an order of combinations of error events for list decoding. An RS decoder can employ a list decoder that uses a pipelined list decoder architecture. The list decoder can include one or more syndrome modification circuits that can compute syndromes in parallel. A long division circuit can include multiple units that operate to compute multiple quotient polynomial coefficients in parallel. The list decoder can employ iterative decoding and a validity test to generate error indicators. The iterative decoding and validity test can use the lower syndromes.

10 Claims, 22 Drawing Sheets

OTHER PUBLICATIONS

G.D. Forney, Jr., "Generalized Minimum Distance Decoding," *IEEE Trans. Infor. Theory*, vol. IT-12, No. 2, Apr. 1966, pp. 125-131.

V. Guruswami, M. Sudan, "Improved Decoding of Reed-Solomon and Algebraic-Geometry Codes," *IEEE Trans. Infor. Theory*, vol. 45, No. 6, Sep. 1999, pp. 1757-1767.

R. Koetter and A. Vardy, "Algebraic Soft-Decision Decoding of Reed-Solomon Codes", *IEEE Trans. Infor. Theory*, vol. 49, No. 11, Nov. 2003, pp. 2809-2825.

M. Sudan, "Decoding of Reed Solomon codes beyond the error-correction bound," J. complexity, vol. 12, pp. 180-193, 1997.

E. Berlekamp, *Algebraic Coding Theory*, pp. 218-240, 1984.

\* cited by examiner

Decision-codeword: n symbols
$$v = (v_1, v_2, v_3, \ldots, v_n)$$
List of most-likely error events: 6 error events

| Error event # (l) | Symbol location ($j_l$) | Symbol value | Next-most-likely symbol value | Error value ($e_l$) |
|---|---|---|---|---|
| l = 1 | $j_1 = 2$ | $v_2$ | $v_{2,m}$ | $e_1 = v_{2,m} - v_2$ |
| l = 2 | $j_2 = 3$ | $v_3$ | $v_{3,m}$ | $e_2 = v_{3,m} - v_3$ |
| ⋮ | | | | |
| l = 6 | $j_6 = n$ | $v_n$ | $v_{n,m}$ | $e_6 = v_{n,m} - v_n$ |

6 error events ⟶ 63 combinations of error events

Error event #

| 1 | 2 | 3 | 4 | 5 | 6 |
|---|---|---|---|---|---|
| 1 | 0 | 0 | 0 | 0 | 0 |
| 0 | 1 | 0 | 0 | 0 | 0 |
| 0 | 0 | 1 | 0 | 0 | 0 |
| 0 | 0 | 0 | 1 | 0 | 0 |
| 0 | 0 | 0 | 0 | 1 | 0 |
| 0 | 0 | 0 | 0 | 0 | 1 |
| 1 | 1 | 0 | 0 | 0 | 0 |
| 1 | 0 | 1 | 0 | 0 | 0 |
| 1 | 0 | 0 | 1 | 0 | 0 |
| ⋮ | | | | | |
| 1 | 1 | 1 | 1 | 1 | 0 |
| 1 | 1 | 1 | 1 | 1 | 1 |

Combinations of error events

FIG. 6

| Clock Interval | Memory Data Bus | | | | | | STEP | Delay Memory Data Bus | | | | | |
|---|---|---|---|---|---|---|---|---|---|---|---|---|---|
| 0 | $S_0$ | $S_1$ | $S_2$ | $S_3$ | $S_4$ | $S_5$ | 0 | | | | | | |
| 1 | $S_6$ | $S_7$ | $S_8$ | $S_9$ | $S_{10}$ | $S_{11}$ | 1 | $S_1$ | $S_2$ | $S_3$ | $S_4$ | $S_5$ | |
| 2 | | | | | | | 2 | $S_7$ | $S_8$ | $S_9$ | $S_{10}$ | $S_{11}$ | |
| 3 | $S_{12}$ | $S_{13}$ | $S_{14}$ | $S_{15}$ | $S_{16}$ | $S_{17}$ | 0 | | | | | | |
| 4 | $S_{18}$ | $S_{19}$ | $S_{20}$ | $S_{21}$ | $S_{22}$ | $S_{23}$ | 1 | $S_{13}$ | $S_{14}$ | $S_{15}$ | $S_{16}$ | $S_{17}$ | |
| 5 | | | | | | | 2 | $S_{19}$ | $S_{20}$ | $S_{21}$ | $S_{22}$ | $S_{23}$ | |

FIG. 18

| Clock Interval | Memory Data Bus | | | | | | Syndrome Modification Output | | | | | |
|---|---|---|---|---|---|---|---|---|---|---|---|---|
| 0 | 0 | 1 | 2 | 3 | 4 | 5 | 0 | 1 | 2 | 3 | 4 | 5 |
| 1 | 6 | 7 | 8 | 9 | 10 | 11 | 6 | 7 | 8 | 9 | 10 | 11 |
| 2 | | | | | | | | | | | | |
| 3 | 12 | 13 | 14 | 15 | 16 | 17 | 12 | 13 | 14 | 15 | 16 | 17 |
| 4 | 18 | 19 | 20 | 21 | 22 | 23 | 18 | 19 | 20 | 21 | 22 | 23 |
| 5 | | | | | | | | | | | | |
| 6 | 24 | 25 | 26 | 27 | 28 | 29 | 24 | 25 | 26 | 27 | 28 | 29 |
| 7 | 30 | 31 | 32 | 33 | 34 | 35 | 30 | 31 | 32 | 33 | 34 | 35 |
| 8 | 36 | 37 | 38 | 39 | 40 | 41 | 36 | 37 | 38 | 39 | 40 | 41 |

FIG. 21

| Clock Interval | Memory Data Bus | | | | | | Delay Memory Data Bus | | | | | | Quotient Coefficient Output | | | |
|---|---|---|---|---|---|---|---|---|---|---|---|---|---|---|---|---|
| 0 | 35 | 34 | 33 | 32 | 31 | 30 |  |  |  |  |  | 36 | 34 | 33 | 32 | 31 |
| 1 | 29 | 28 | 27 | 26 | 25 | 24 | 35 | 34 | 33 | 32 | 31 | 30 | 30 | 29 | 28 | 27 |
| 2 |  |  |  |  |  |  | 29 | 28 | 27 | 26 | 25 | 24 | 26 | 25 | 24 | 23 |
| 3 | 23 | 22 | 21 | 20 | 19 | 18 |  |  |  |  |  |  | 22 | 21 | 20 | 19 |
| 4 | 17 | 16 | 15 | 14 | 13 | 12 | 23 | 22 | 21 | 20 | 19 | 18 | 18 | 17 | 16 | 15 |
| 5 |  |  |  |  |  |  | 17 | 16 | 15 | 14 | 13 | 12 | 14 | 13 | 12 | 11 |
| 6 | 11 | 10 | 9 | 8 | 7 | 6 |  |  |  |  |  |  | 10 | 9 | 8 | 7 |
| 7 | 5 | 4 | 3 | 2 | 1 | 0 | 11 | 10 | 9 | 8 | 7 | 6 | 6 | 5 | 4 | 3 |
| 8 |  |  |  |  |  |  | 5 | 4 | 3 | 2 | 1 | 0 | 2 | 1 | 0 | r |

FIG. 22

ARCHITECTURE AND CONTROL OF REED-SOLOMON LIST DECODING

CROSS-REFERENCE TO RELATED APPLICATIONS

This application is a divisional of U.S. patent application Ser. No. 12/256,652 filed Oct. 23, 2008, which is a divisional of U.S. patent application Ser. No. 11/195,183 filed Aug. 1, 2005, now U.S. Pat. No. 7,454,690 which claims the benefit of U.S. Provisional Application Nos. 60/622,429, filed Oct. 27, 2004, and 60/680,969, filed May 12, 2005 which are incorporated herein by reference in their entirety.

BACKGROUND OF THE INVENTION

This invention relates to Reed-Solomon error-correction codes (RS ECC) and, more particularly, to systems and methods for implementing the RS ECC receive-side operations.

Electronic information is increasingly being relied upon as a preferred medium for conducting business and/or personal transactions. As a result, demands for even better information storage and/or communication technologies are also increasing. The advances in this area of technology are apparent in telecommunication and information storage devices, where developments in throughput and storage density are allowing users to process information at much greater rates and quantities than before.

To guarantee some degree of information integrity, many communications and storage devices include error-correction technologies. Such technologies generally involve configuring information in a way that allows the information to be recoverable even when parts of the information are altered or missing. In error-correction, this process of configuring information is referred to as "encoding," and the counterpart process of recovering information is referred to as "decoding." Therefore, unless otherwise specified, the term "coding" will be used herein to refer to a particular way of encoding and decoding information.

In the field of error-correction codes (ECC), of particular note is the Reed-Solomon (RS) error-correction code. Since its discovery, the Reed-Solomon ECC has had a profound impact on the information industry in terms of shaping consumer expectations. In modern day applications, the Reed-Solomon ECC can be found in everyday devices such as the compact disk players, where RS ECC technology has helped to provide high quality audio playback even from scratched CD surfaces.

Despite its effectiveness, the suitability of the Reed-Solomon ECC in certain applications may be limited by practical considerations. RS ECC encoding and decoding techniques are relatively complex, and practical issues generally concern whether RS ECC operations can be completed in the time and using the resources allotted by an application. Interestingly, when the RS ECC was first developed, processing technology had not yet developed to the point where applying the RS ECC in consumer devices was practical. Although technology for implementing RS ECC has improved greatly since then, technological improvements in applications that benefit from RS ECC have also kept pace. Accordingly, allowances of time, power, and/or hardware resources for RS ECC in modern applications continue to become more stringent.

Developments in coding theory continue to improve the capabilities of the RS ECC. In conjunction with these efforts, device and architectural improvements in implementation continue to aid its application to conventional and emerging electronic devices. Accordingly, there is continued interest in improving the Reed-Solomon error-correction code on both a theoretical and a practical level.

SUMMARY OF THE INVENTION

In accordance with the disclosed invention, systems and methods are provided for implementing various aspects of a Reed-Solomon (RS) error-correction coding system (ECC). In general, a decoder that uses soft-information to perform decoding is referred to as a "soft decoder" and a decoder that does not use soft-information to perform decoding is referred to as a "hard decoder." The discloses systems and methods provide a hard a Reed-Solomon ECC RS(n,k) that has the capability to correct up to $t=(n-k)/2$ symbols in a decision-codeword. When the number of symbol errors in a decision-codeword is greater than $t=(n-k)/2$, a soft RS ECC decoder system and method using soft-information is provided that has the capability to correct more than t errors. Where a RS ECC decoder is referred to herein without a "soft" or "hard" designation, it will be understood that the RS ECC decoder can refer to one or both types of RS ECC decoders.

An RS decoder can include an input interface for receiving a decision-codeword and a soft-information component that can receive and store soft-information for the decision-codeword. The soft-information can include a list of most-likely error events, a list of next-most-likely values, and one or more incidence vectors that indicate combinations of the most-likely error events. The soft-information can be used by the RS decoder to decode a decision-codeword that contains more than t symbol errors. The incidence vectors can be ordered in a manner that decreases the amount of memory needed to maintain error indicators during list decoding. In one embodiment, each incidence vector can be associated with an indicator that specifies whether an error indicator corresponding to the incidence vector should be stored.

In one embodiment, a list decoder can include a pipelined architecture that contains a number of pipeline stages. The pipelined architecture can operate based on a clock signal that indicates clock intervals, where two or more clock intervals can correspond to a computing interval of the pipelined architecture. A first pipeline stage can perform syndrome modification and long division operations, and a second pipeline stage can compute new error indicators using iterative decoding. A third pipeline stage can perform a validity test to predict whether the error indicators produced by iterative decoding are potentially valid. In one embodiment, the iterative decoding operation can be separated across two pipeline stages, where one stage can compute values $d_1$, $d_2$, $d_3$, and $d_4$ used in iterative decoding, and where the other stage can complete the iterative decoding computation.

In one embodiment, a list decoder can include an iterative decoding memory for storing error indicators between decoding iterations. Additionally, a list decoder can include FIFO memory components between pipeline stages in the pipelined architecture. A list decoder can include delay memory components that interact with the iterative decoding memory, the pipeline stages, and/or other circuits and components in the list decoder.

A list decoder using iterative decoding can include one or more syndrome modification circuits that can generate modified syndromes serially and/or in parallel. A syndrome modification circuit according to one aspect of the disclosed invention can perform its computation recursively. The recursion loop in the syndrome modification circuit can include a storage element, a multiplexor, and a multiplier. In one embodiment, multiple syndrome modification circuits can operate in parallel and can be timed by a clock signal. A list decoder employing iterative decoding can also include long division circuitry for computing quotient and remainder values resulting from polynomial division operations. In one embodiment, the coefficients of a quotient polynomial can be generated in parallel, where the results of one parallel computation can be used in a subsequent parallel computation.

In one aspect of the disclosed invention, although syndromes $S_0^{(ei)}, \ldots, S_{2t-1}^{(ei)}$ may be available, iterative decoding and the validity test can operate using fewer than 2t syndromes. In one embodiment, iterative decoding and the validity test can be performed using only the subset of syndromes $S_0^{(ei)}, \ldots, S_{t+\delta}^{(ei)}$, where $\delta$ is a positive integer such as $\delta=2$ or $\delta=3$.

In one aspect of the invention, an RS decoder can include an input means for receiving a decision-codeword and a soft-information means for receiving and storing soft-information for the decision-codeword. The soft-information means can include a list of most-likely error events, a list of next-most-likely values, and one or more incidence vectors that indicate combinations of the most-likely error events. The soft-information can be used by a soft-decoding means to decode a decision-codeword that contains more than t symbol errors. The incidence vectors can be ordered in a manner that decreases the amount of memory needed to maintain error indicators during list decoding. In one embodiment, an indicator means can specify whether an error indicator corresponding to the incidence vector should be stored.

In one embodiment, a list decoder means can include a pipelined architecture that contains a number of pipelined means. The pipelined architecture can operate based on a clock means that indicates clock intervals, where two or more clock intervals can correspond to a computing interval of the pipelined architecture. The pipelined architecture can include a first pipelined means for performing syndrome modification and long division operations, a second pipelined means for computing new error indicators using iterative decoding, and a third pipelined means for performing a validity test to predict whether the error indicators produced by iterative decoding are potentially valid. In one embodiment, the second pipelined means can be separated into across two pipeline stages, where one stage can include means for computing values $d_1, d_2, d_3$, and $d_4$ used in iterative decoding, and where the other stage can include means for computing the remaining portions of the iterative decoding computation.

In one embodiment, a list decoding means can include interactive decoding memory means for storing error indicators between decoding iterations. Additionally, a list decoding means can include memory means between pipeline stages in the pipelined architecture. A list decoding means can include delay memory means that interact with the iterative decoding memory means, the pipeline stages, and/or other components in the list decoding means.

A list decoding means using iterative decoding can include one or more syndrome modification means for generating modified syndromes serially and/or in parallel. A syndrome modification means according to one aspect of the disclosed invention can perform its computation recursively. The recursion loop in the syndrome modification means can include a storage element, a multiplexor, and a multiplier. In one embodiment, multiple syndrome modification means can operate in parallel and can be timed by a clock signal. A list decoding means employing iterative decoding can also include long division means for computing quotient and remainder values resulting from polynomial division operations. In one embodiment, the coefficients of a quotient polynomial can be generated in parallel, where the results of one parallel computation can be used in a subsequent parallel computation.

In one aspect of the disclosed invention, although syndromes $S_0^{(ei)}, \ldots, S_{2t-1}^{(ei)}$ may be available, an iterative decoding means and a validity test means can operate using fewer than 2t syndromes. In one embodiment, an iterative decoding means and a validity test means can be performed using only the subset of syndromes $S_0^{(ei)}, \ldots, S_{t+\delta}^{(ei)}$, where $\delta$ is a positive integer such as $\delta=2$ or $\delta=3$.

In one aspect of the invention, an RS decoder can include a computer program running on a processor performing the steps of receiving a decision-codeword from an input connection and receiving and storing soft-information for the decision-codeword. The soft-information can include a list of most-likely error events, a list of next-most-likely values, and one or more incidence vectors that indicate combinations of the most-likely error events. The soft-information can be used by the computer program to decode a decision-codeword that contains more than t symbol errors. The incidence vectors can be ordered in a manner that decreases the amount of memory needed to maintain error indicators during list decoding. In one embodiment, an indicator can specify whether an error indicator corresponding to the incidence vector should be stored.

In one embodiment, a computer program running on a processor can perform syndrome modification and long division, compute new error indicators using iterative decoding, and perform a validity test to predict whether the error indicators produced by iterative decoding are potentially valid. In one embodiment, the computer program can perform these operations substantially in parallel using, for example, multitasking or multi-threading technology. In one embodiment, the iterative decoding operation can be separated into two distinct computations, where one computation can compute values $d_1, d_2, d_3$, and $d_4$ used in iterative decoding, and where the other computation can compute the remaining portions of the iterative decoding computation.

In one embodiment, a computer program running on a processor can store error indicators in a memory between iterative decoding iterations. In particular, a computer program can store intermediate results from different computations in a memory between computations.

In one embodiment, a computer program can generate one or more modified syndromes in multiple iterations. A computer program can generate modified syndromes using a recursive technique. In one embodiment, a computer program can perform long division to compute quotient and remainder values resulting from polynomial division operations. The computer program can compute one or more coefficients of a quotient polynomial in multiple iterations, where the results of one iteration can be used in a subsequent iteration.

In one aspect of the disclosed invention, although syndromes $S_0^{(ei)}, \ldots, S_{2t-1}^{(ei)}$ may be available, a computer program running on a processor can perform iterative decoding and/or a validity test using fewer than 2t syndromes. In one embodiment, a computer program can perform iterative decoding and a validity test using only the subset of syndromes $S_0^{(ei)}, \ldots, S_{t+\delta}^{(ei)}$, where $\delta$ is a positive integer such as $\delta=2$ or $\delta=3$.

Further features of the invention, its nature and various advantages, will be more apparent from the accompanying drawings and the following detailed description of the various embodiments.

BRIEF DESCRIPTION OF THE DRAWINGS

FIG. 5 is a table of exemplary soft-information for a list of most-likely error events;

FIG. 6 is a list of incidence vectors that corresponds to six error events;

FIG. 18 is table showing the selection of input values in the circuitry of FIG. 17;

FIG. 21 is a table showing the timing and progression of syndrome modification computations in the list decoder of FIG. 20; and FIG. 22 is a table showing the timing and progression of long division computations in the list decoder of FIG. 20.

DETAILED DESCRIPTION

This application is related to the application entitled "Architecture and Control of Reed-Solomon Error-Correction Decoding", Ser. No. 11/195,087, and the application entitled "Architecture and Control of Reed-Solomon Error Evaluation and Correction", having Ser. No. 11/195,403, which applications are hereby incorporated herein by reference in their entirety.

The disclosed technology is directed to systems and methods for implementing a Reed-Solomon error-correction code (RS ECC). In applications or devices where information may be altered by interference signals or other phenomena, Reed-Solomon ECC provides a measured way to protect information against such interference. As used herein, "information" refers to any unit or aggregate of energy or signals that contain some meaning or usefulness.

Figure 1:
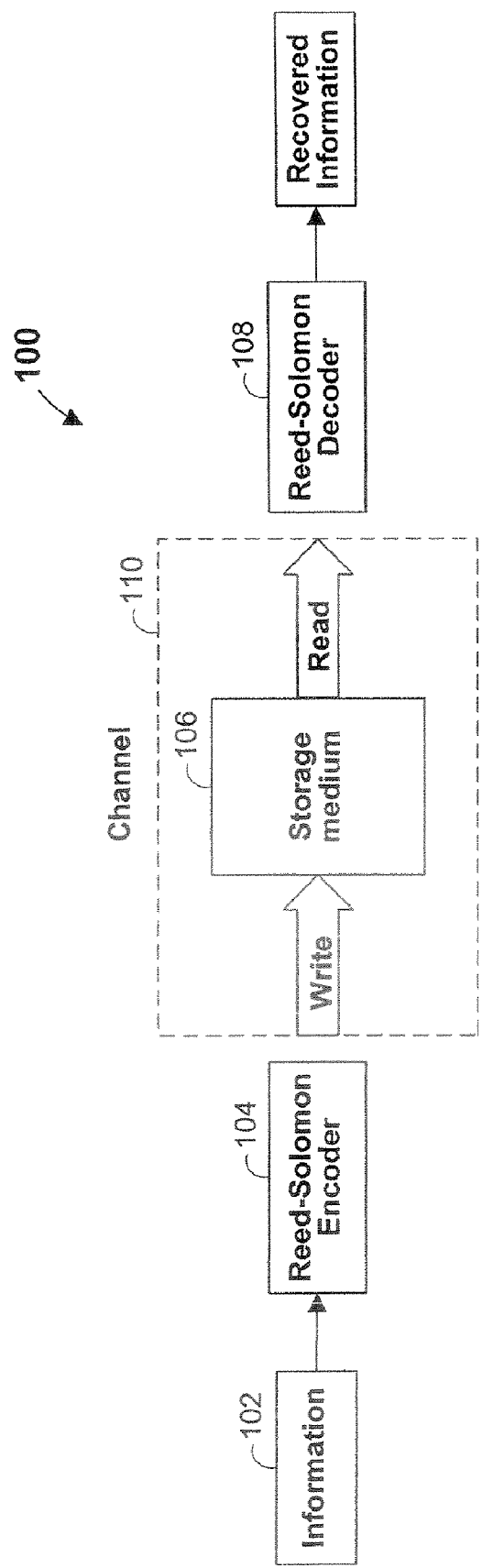
FIG. 1 is a component diagram of an exemplary storage system that employs Reed-Solomon error-correction coding (RS ECC)

Referring to FIG. 1, there is shown an exemplary information storage system 100 that employs a Reed-Solomon error-correction code. Information 102 that is intended for storage can be encoded by a RS ECC encoder 104 before being written to the storage medium 106. Upon retrieving the encoded information from the storage medium, an RS ECC decoder 108 can decode the retrieved information to recover the original information 102. The Reed-Solomon ECC is described in U.S. patent application Ser. No. 11/006,381 (filed Dec. 7, 2004, hereinafter the "Burd reference"), which is hereby incorporated herein by reference in its entirety. Unless otherwise specified, the terminology used in the Burd reference will also apply herein.

With continuing reference to FIG. 1, the RS ECC provides some protection for the information stored on the storage medium 106. This information may encounter a number of error-producing phenomena, such as device physical failure, device electrical failure, signal interference, and/or data loss due to buffer overflow, for example. As used herein, a "channel" will refer to the devices and/or processing stages that occur between an RS ECC encoder and an RS ECC decoder and can correspond to a particular path of media/devices through which a signal can flow, a particular wavelength or time slot which a signal can utilize, and/or another multiple access scheme. For example, in FIG. 1, the channel 110 can correspond to storage and write and read components of a disk drive, including a magnetic storage medium, a disk-drive read/write head, and other storage system components. As used herein, a "read path" of a storage system that stores encoded information includes components and devices that operate to produce un-encoded information and can include an RS ECC decoder 108. Also, the interference signals and other error-producing phenomena in a channel will be referred to herein as "noise." The terms channel and noise are more conceptual than physical and are often difficult to define physically. Even so, as shown by FIG. 1, they do correspond to physical components and devices.

Figure 2:
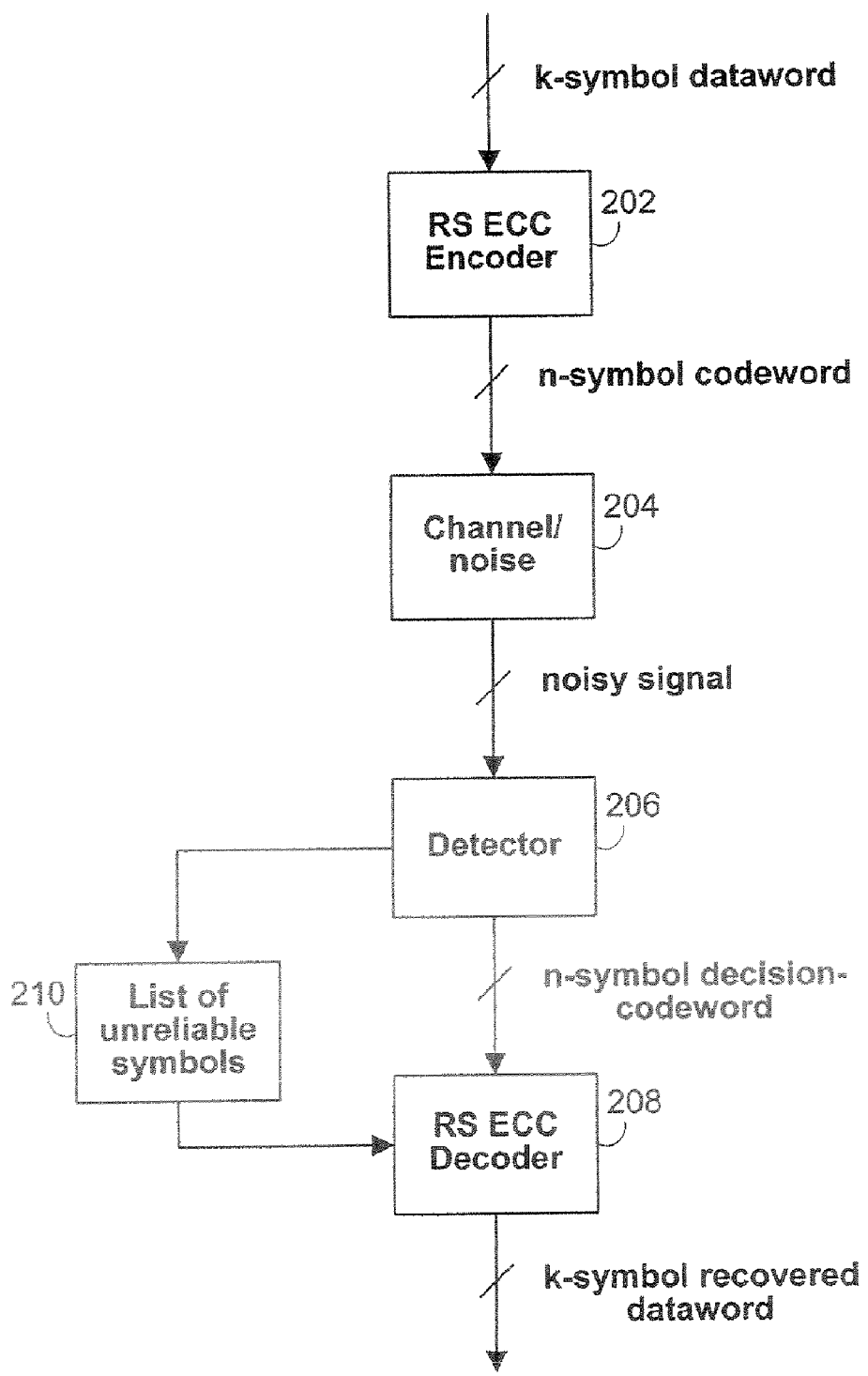
FIG. 2 is a component diagram of a generic system that employs soft-information with Reed-Solomon error-correction coding.

As described in the Burd reference, an RS ECC operates based on units of information called "symbols" and "words," and the operations occur in an encoder and a decoder. Referring to FIG. 2, an RS ECC encoder 202 generally operates to convert a k-symbol dataword into an n-symbol codeword of greater length. Because of this, a Reed-Solomon code is generally identified in shorthand as RS(n,k). RS(n,k) is referred to as a "systematic" code if the n-symbol codeword contains the original k-symbol dataword. These original k symbols are called systematic symbols and the additional (n−k) symbols in the codeword are called "parity" symbols. The n-symbol codeword can be communicated over a channel 204. While in the channel 204, the signal may encounter noise so that an n-symbol word that corresponds to a noisy signal received by a detector 206 may be different from the corresponding codeword that entered the channel 204. This n-symbol word produced by the detector 206 is called a decision-codeword. Thus, the task of the RS ECC decoder 208 is to recover the original dataword from a decision-codeword.

An RS ECC decoder may not always be able to recover the original dataword. As described in the Burd reference, an RS ECC decoder 208 that does not use soft-information is capable of correcting up to $t=(n-k)/2$ symbol errors in a decision-codeword. In contrast, when the RS ECC decoder 208 uses soft-information to perform decoding, the RS ECC decoder 208 is capable of correcting more than t symbol errors. In practice, an RS ECC decoder first determines whether the errors in a decision-codeword can be corrected. This computation involves two procedures known as the Berlekamp-Massey algorithm (BMA algorithm) and the Chien search, which are described in the Burd reference. In summary, the BMA algorithm produces an error indicator based on the decision-codeword, and the Chien search determines whether the error indicator is "valid." Mis-corrections notwithstanding, if the error indicator is determined to be valid, then the number of symbol errors in the decision-codeword is less than or equal to t. In this case, the RS ECC decoder 208 can correct the errors in the decision-codeword using the Forney algorithm, for example.

In some instances, the number of symbol errors in a decision-codeword may exceed t. In this case, the Burd reference describes a technique known as "list decoding" that may be used to reduce the number of symbol errors in a decision-codeword. List decoding is also described in U.S. patent application Ser. No. 10/135,422, filed Apr. 29, 2002, and in U.S. patent application Ser. No. 10/313,651, filed Dec. 6, 2002, which applications are incorporated herein by reference in their entirety.

List decoding relies on identifying a list of unreliable symbols 210 in a decision-codeword and the symbols' next-most-likely values. This list and these values can be generated by a detector 206 or a post processor (not shown). One way to do so is described in U.S. patent application Ser. No. 09/901,507, filed Jul. 9, 2001, which is hereby incorporated herein by reference in its entirety. Essentially, list decoding is more or less a guess and check technique that may or may not locate and correct errors in a decision-codeword. Based on the premise that low-reliability symbols are more likely to have been detected incorrectly, replacing one or more low-reliability symbols with their next-most-likely values can reduce the number of symbol errors if any of the next-most-likely values happens to be a true and correct value. A decision-codeword whose symbols have been replaced as described is referred to as a modified decision-codeword. In one embodiment, whether the number of errors in a modified decision-codeword still exceeds t can be determined, as before, by applying the BMA algorithm and the Chien search. In embodiments where computation speed is a concern, other computations may be used in place of the BMA algorithm and Chien search. For example, the Burd reference describes an iterative way of generating error indicators, which will be referred to herein as "iterative decoding." While the Burd reference describes one way to perform iterative decoding, other variations are also possible and will now be described. Specifically, starting with error indicators ($\Lambda(x)$, $B(x)$, $S(x)$) for a decision-codeword, new error indicators $$\left(\hat{\Lambda}^{(e_1)}(x) = \frac{\Lambda^{(e_1)}(x)}{x + \alpha^{-j_1}}, B^{(e_1)}(x), S^{(e_1)}(x)\right)$$

for a modified decision-codeword can be computed by using the computations below:

Case 1:

$$\deg(\Lambda(x)) < \deg(B(x)) + 2$$

$$\Lambda^{(ei)}(x) = \Lambda(x) + ax\Lambda(x) + bxB(x) \quad \text{(EQ1)}$$

$$B^{(ei)}(x) = \Lambda(x) + cB(x) \quad \text{(EQ2)}$$

Case 2:

$$\deg(\Lambda(x)) \geq \deg(B(x)) + 2$$

$$\Lambda^{(ei)}(x) = \Lambda(x) + axB(x) + bx^2B(x) \quad \text{(EQ3)}$$

$$B^{(ei)}(x) = xB(x)cB(x) \quad \text{(EQ4)}$$

where the variables and their computations are described by the Burd reference.

The computations for equations EQ3 and EQ4 in case two are not shown in the Burd reference because the Burd reference recognizes that case two can be handled in a manner similar to case one. For the sake of completeness, one embodiment for computing equations EQ3 and EQ4 in case two will now be described. Starting with syndromes $S(x)$, an error locator polynomial $\Lambda(x)$, and a scratch polynomial $B(x)$ for a decision-codeword, a modified syndrome polynomial $S_i^{(ei)}(x)$, quotient polynomials $Q_\Lambda(x)$, $Q_{x\Lambda}(x)$, $Q_B(x)$, $Q_{xB}(x)$, $Q_{x^2B}(x)$, and remainder values $r_\Lambda$, $r_{x\Lambda}$, $r_B$, $r_{xB}$, $r_{x^2B}$ can be computed in the same way as case one. Based on these values, intermediate variables $d_1$, $d_3$, and $d_4$ can be computed by:

$$d_1 = \sum_{i=0} S_{2t-1-i}^{(e_1)}(Q_\Lambda)_i \quad \text{(EQ5)}$$

$$d_3 = \sum_{i=0} S_{2t-1-i}^{(e_1)}(Q_{xB})_i$$

$$d_4 = \sum_{i=0} S_{2t-1-i}^{(e_1)}(Q_{x^2B})_i.$$

The upper bound of the summations are not specified to indicate that the degree of the polynomials in the equations can vary. Also, the intermediate variable D can be computed by:

$$D = \text{determinant}\begin{bmatrix} r_{xB} & r_{x^2B} \\ d_3 & d_4 \end{bmatrix} = d_4 * r_{xB} - r_{x^2B} * d_3. \quad \text{(EQ6)}$$

If D=0, then the new error indicators cannot be computed using iterative decoding, and another technique such as the BMA algorithm will need to be used. On the other hand, if D is not equal to 0, then variables a, b, and c can be computed and are given by:

$$a = (r_\Lambda d_3 + r_{x^2B} d_1)D^{-1} \quad \text{(EQ7)}$$

$$b = \begin{cases} (d_1 + ad_3)d_4^{-1}, & \text{if } d_4 \neq 0 \\ (r_\Lambda + ar_{xB})r_{xB}^{-1}, & \text{if } d_4 \neq 0 \end{cases}$$

$$c = r_{xb}r_B^{-1}.$$

The computed values a, b, and c, can then be used in equations EQ3 and EQ4 to compute the new error locator polynomial $\Lambda^{(ei)}(x)$ and the new scratch polynomial $B^{(ei)}(x)$, respectively. Then, the polynomial $$\hat{\Lambda}^{(e_1)}(x) = \frac{\Lambda^{(e_1)}(x)}{x + \alpha^{-j_1}}$$

can be computed in one embodiment by dividing $\hat{\Lambda}^{(ei)}(x)$ by $(x+a^{-ji})$. In another embodiment, $\hat{\Lambda}^{(ei)}(x)$ can be computed without a division operation by directly using the previously computed quotient polynomials, as follows:

Case 1:

$$\deg(\Lambda(x)) < \deg(B(x)) + 2$$

$$\hat{\Lambda}^{(e_1)}(x) = \frac{\Lambda^{(e_1)}(x)}{x + \alpha^{-j_1}} = \frac{\Lambda(x) + ax\Lambda(x) + bxB(x)}{x + \alpha^{-j_1}} \quad \text{(EQ8)}$$

$$= Q_\Lambda(x) + axQ_\Lambda(x) + bxQ_B(x)$$

Case 2:

$$\deg(\Lambda(x)) \geq \deg(B(x))+2$$

$$\hat{\Lambda}^{(e_1)}(x) = \frac{\Lambda^{(e_1)}(x)}{x+\alpha^{-j_1}} = \frac{\Lambda(x) + axB(x) + bx^2B(x)}{x+\alpha^{-j_1}} \quad (EQ9)$$
$$= Q_\Lambda(x) + axQ_B(x) + bx^2Q_B(x)$$

For a new error locator polynomial, the Burd reference describes a way to predict the validity of the error locator polynomial by using a "validity test." Specifically, when there is one extra syndrome, the validity test is:

$$\sum_i S_{2t-i}\Lambda_i^{(e_1)} = 0, \quad (EQ10)$$

and when there are $\Delta$ extra syndromes, the validity test is:

$$\sum_i S_{2t-1+j-i}\Lambda_i^{(e_1)} = 0, \; j=1,\ldots,\Delta. \quad (EQ11)$$

One of equations EQ10 and EQ11 is used depending on the number of extra syndromes. When the equality or equalities are determined to be true, the new error locator polynomial can be presumed to be valid and can be passed to a Chien search module where it's validity can be verified. Alternatively, the validity test of equations EQ10 and EQ11 can be modified to use the modified syndromes and $\hat{\Lambda}^{(ei)}(x)$. When there is one extra syndrome, the validity test becomes:

$$\sum_i S_{2t-i}^{(e_1)}\hat{\Lambda}_i^{(e_1)} = 0, \quad (EQ12)$$

and when there are $\Delta$ extra syndromes, the validity test becomes:

$$\sum_i S_{2t-1+j-i}^{(e_1)}\hat{\Lambda}_i^{(e_1)} = 0, \; j=1,\ldots,\Delta. \quad (EQ13)$$

Equations EQ12 and EQ13 operate in the same way as equations EQ10 and EQ11 so that when the equality or equalities are determined to be true, the new error locator polynomial can be presumed to be valid.

In one aspect of the disclosed invention, iterative decoding can be performed by using an alternative set of equations from those described in the Burd reference or above herein. Specifically, first $\Delta$ syndromes $(0, 1, \ldots, \Delta-1)$ can be used for validity check, and last 2t syndromes $(\Delta, \ldots, 2t+\Delta-1)$ can be used for BMA and iterative decoding. Furthermore, rather than computing the syndromes $S_i^{(ei)}$ for $i=t, \ldots, 2t$, and using them to compute the variables $d_1$, $d_3$, and $d_4$ in equation EQ5, an alternative set of equations can use the "lower" syndromes $S_i^{(ei)}$, $i=0, \ldots, t+\delta$, where $\delta$ is an integer value and, in one embodiment, is $\delta=2$ or $\delta=3$. Specifically, equations EQ5 and EQ10-EQ13 above are affected by this modification. Using the lower syndromes, equation EQ5 is replaced by EQ14 below:

$$d_1 = \sum_{i=0} S_{t+\delta-i}^{(e_1)}(Q_\Lambda)_i \quad (EQ14)$$
$$d_3 = \sum_{i=0} S_{t+\delta-i}^{(e_1)}(Q_{xB})_i$$
$$d_4 = \sum_{i=0} S_{t+\delta-i}^{(e_1)}(Q_{x^2B})_i.$$

For case one where $\deg(\Lambda(x)) < \deg(B(x))+2$, the values $d_1$ and $d_3$ are computed as shown in equation EQ14, but the value $d_2$ is computed instead of $d_4$ by:

$$d_2 = \sum_{i=0} S_{t+\delta-i}^{(e_1)}(Q_{x\Lambda})_i. \quad (EQ15)$$

By using the lower syndromes, equations EQ10-EQ11 are replaced by:

$$\sum_{i=0}^{v} \left(S_{v-i}^{(e_l)}\hat{\Lambda}_i^{(e_l)}\right) = 0, \quad (EQ16)$$

$$\sum_{i=0}^{v} \left(S_{v+j-i}^{(e_l)}\hat{\Lambda}_i^{(e_l)}\right) = 0, \; j=1,\ldots,\Delta \quad (EQ17)$$

where v is the degree of $\hat{\Lambda}_i^{(ei)}$. Equations EQ12-EQ13 are replaced in the same way as equations EQ10-EQ11.

From hereon, it will be assumed that list decoding uses iterative decoding to generate error indicators for a modified decision-codeword and predicts the validity of the error indicators using the validity test. Also, it will be assumed that iterative decoding computations use the lower syndromes as shown in equations EQ14-EQ17.

Figure 3:
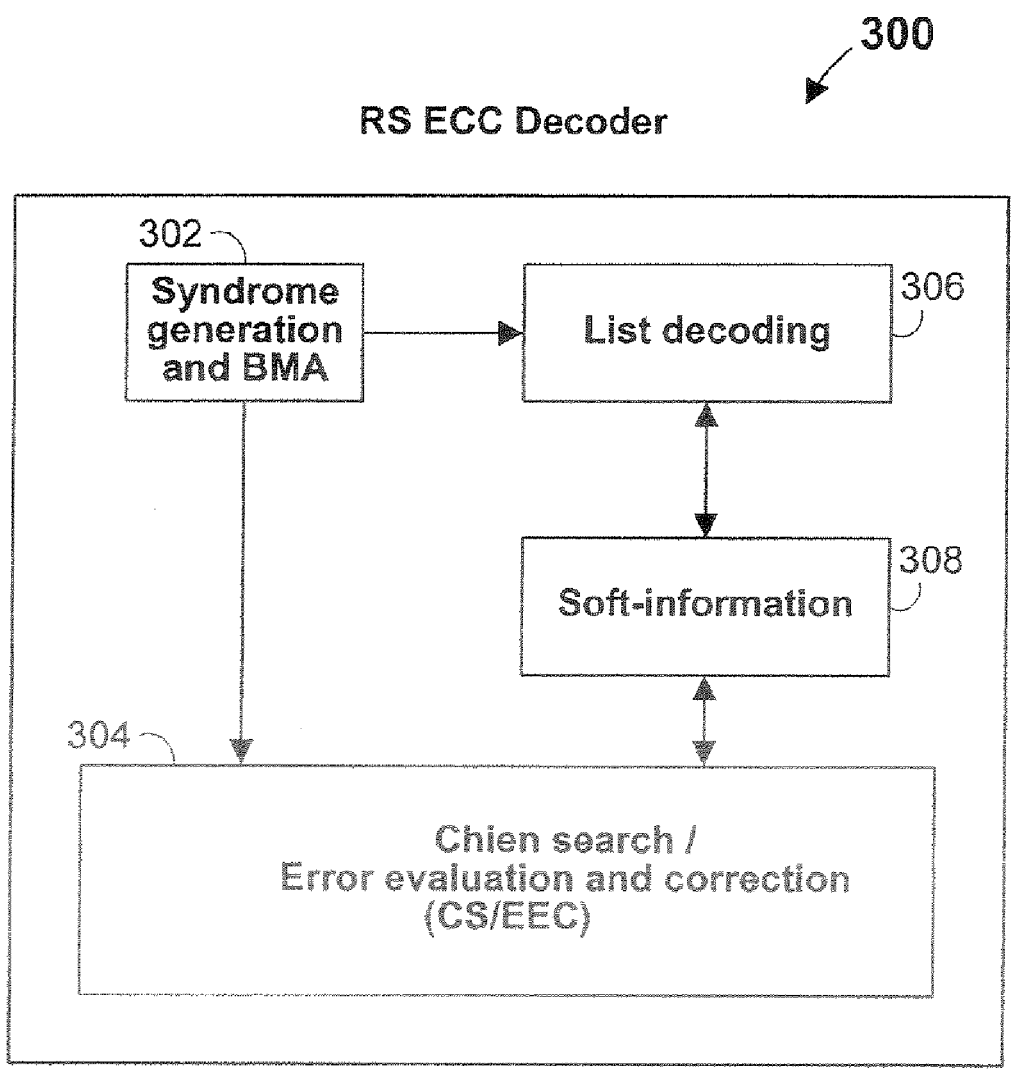
FIG. 3 is a component diagram of an exemplary Reed-Solomon ECC decoder that employs soft-information and list decoding.

Referring now to FIG. 3, there is shown one embodiment of an RS ECC decoder 300. In accordance with what has been described thus far, the exemplary RS ECC decoder includes a BMA algorithm component 302, a Chien search/error evaluation and correction component ("CS/EEC" component) 304, a list decoding component 306, and a soft-information component 308. The soft-information component 308 can store and/or access the list of least reliable symbols and the corresponding next-most-likely values. The RS ECC decoder 300 and its components can be implemented using digital hardware, analog hardware, and/or a processor architecture with programmable instructions. Furthermore, two or more components may operate in whole or in part based on shared circuitry and/or other shared resources.

Figure 4:
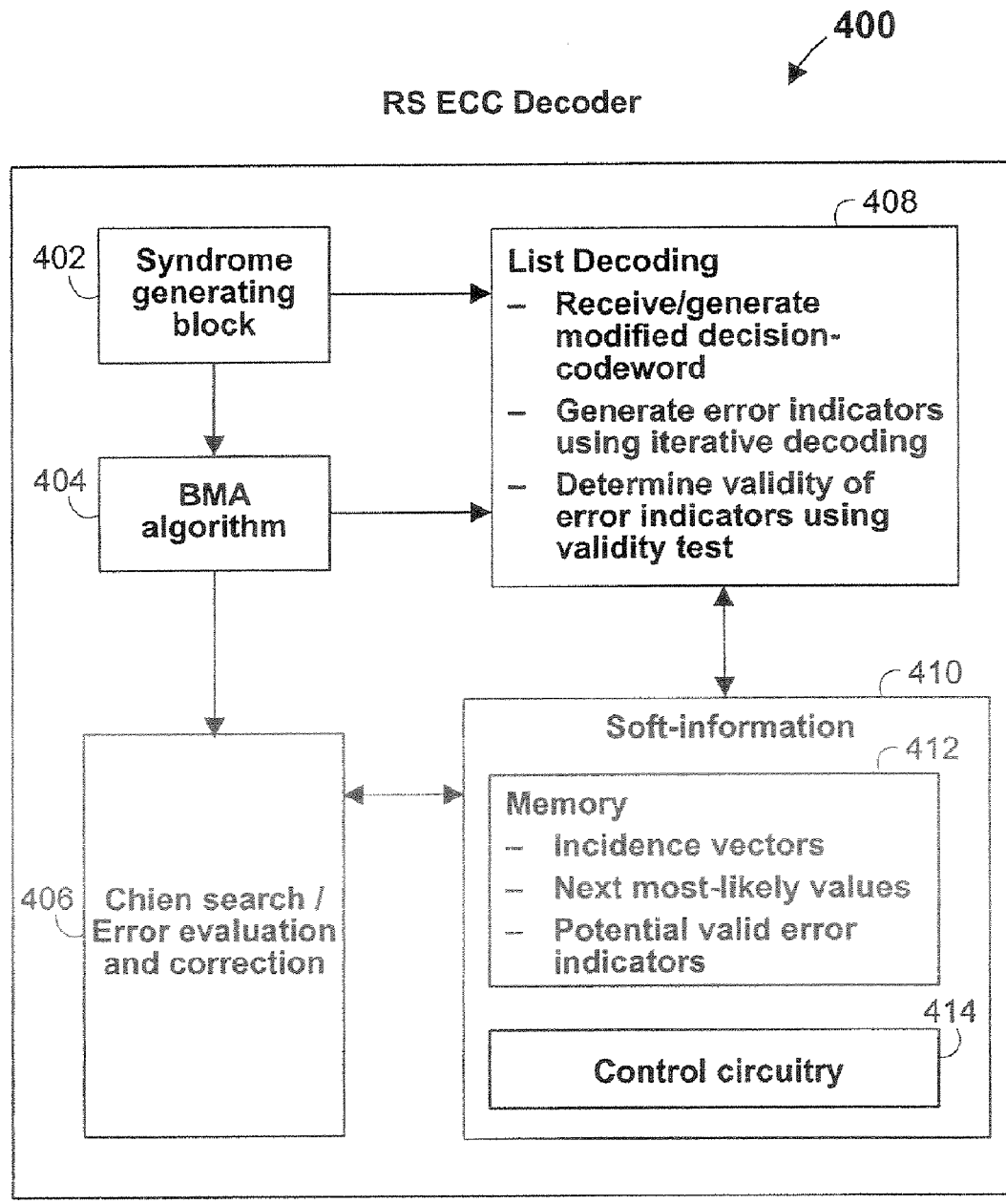
FIG. 4 is a more detailed component diagram of a RS ECC decoder.

Referring to FIG. 4, there is shown a variation of the RS ECC decoder of FIG. 3. In the illustrated embodiment, there is an additional syndrome generating component 402 that was part of the BMA component of FIG. 3. The syndrome generating component 402 produces syndromes based on a decision-codeword, and the BMA algorithm component 404 uses the syndromes to produce error indicators for the decision-codeword. The error indicators can be communicated to the CS/EEC component 406 where the Chien search can determine its validity. The error indicators can also be communicated to the list decoding component 408 for use in iterative decoding. Also for iterative decoding, the list decoding component 408 can receive syndromes from the syndrome generating component 402 or the BMA algorithm component 404.

If the CS/EEC component 406 determines that the error indicator from the BMA algorithm component 404 is invalid, it can provide a notification to a control circuit 414 in the soft-information component 410. In response, the control circuitry 414 can initiate the list decoding component. The soft-information component 410 can contain an internal memory 412 or, alternatively, can communicate with an external memory (not shown) for access to soft-information. The memory 412 can contain incidence vectors that correspond to combinations of symbol errors and next-most-likely values that provide alternative values for the symbols. In one embodiment, the control circuitry 414 can communicate an individual incidence vector and its corresponding next-most-likely value(s) to the list decoding component 408. In response, the list decoding component 408 can generate a modified decision-codeword based on the incidence vector and the next-most-likely value(s). In one embodiment, the soft-information component 410 can generate the modified decision-codeword and can communicate it to the list decoding component 408. If the list decoding component 408 identifies any potentially valid error indicators, it can communicate them to the soft-information component 410 for storage in the memory 412. After a predetermined number or all of the incidence vectors have been processed, the soft-information component 410 can communicate the error indicators in the memory 412, if any, to the CS/EEC component 406 for a Chien search and, if appropriate, for error evaluation and correction.

FIG. 5 illustrates one example of a decision-codeword and a list of most-likely error events 500. For the purpose of explanation, the list of most-likely error events 500 is shown to include six error events designated as l=1, . . . , 6. The number of error events illustrated is exemplary and other numbers can be used. Each error event l corresponds to a symbol in the decision-codeword located at a position $j_l$ in the decision-codeword. As shown in the first row of the table in FIG. 5, error event l=1 corresponds to symbol location $j_1$=2. The value of symbol two in the decision-codeword is $v_2$, and the next-most-likely value, generated by a detector or a post-processor, is $v_{2,m}$. Thus, the value of the potential error $e_l$ for error event l=1 is $e_1=(v_{2,m}-v_2)$. The illustrated list of most-likely error events 500 is exemplary. A list of most-likely error events may contain a subset of the values shown in FIG. 5 and/or may contain other soft-information that may be generated by a detector or a post-processor. For example, a list of most-likely error events may contain only one of a next-most-likely value $v_{l,m}$ 502 and an error value $e_l$ 504, since the two values contain the same information. In one embodiment, a list of most-likely error events does not include decision-codeword symbol values 506. With reference also to FIG. 4, the list of most-likely error events 500 in FIG. 5 can in one embodiment be stored in a memory 412 of a soft-information component 410.

Although a list of most-likely error events represents potential symbol errors in a decision-codeword, a list decoder may not have information about which errors events are actual errors and which are not. Accordingly, a list decoder may need to process several combinations of error events to produce a valid error indicator. Referring to FIG. 6, there is shown a table 600 of error event combinations. A list of six error events corresponds to sixty-three combinations of error events. Each combination in the table occupies a single row, where a "one" indicates that a particular error event is included in the combination. A single row/combination's zeros and ones are referred to collectively herein as an "incidence vector." In the ideal case, a list decoder can process all of the combinations of error events. In some embodiments, a list decoder can process a subset of all of the combinations of error events. The incidence vectors can be generated and/or stored in a variety of ways. In one embodiment and with reference also to FIG. 4, a memory 412 in a soft-information component 410 can store all or a subset of the incidence vectors. In one embodiment, rather than storing the incidence vectors in a memory 412, a soft-information module 410 can include a counter (not shown) that produces incidence vectors. For example, a list of six most-likely error events can correspond to a six-bit counter, where the bits of the counter indicate which error events are included in an incidence vector.

From hereon, it will be assumed that the values shown in FIG. 5 and the incidence vectors shown in FIG. 6 are maintained by a soft-information component. The following description assumes that the soft-information of FIG. 5 has been generated by a detector and/or a post processor based on a decision-codeword that contains more than t symbol errors. Since the decision-codeword contains more than t errors, list decoding will be needed.

Figure 7:
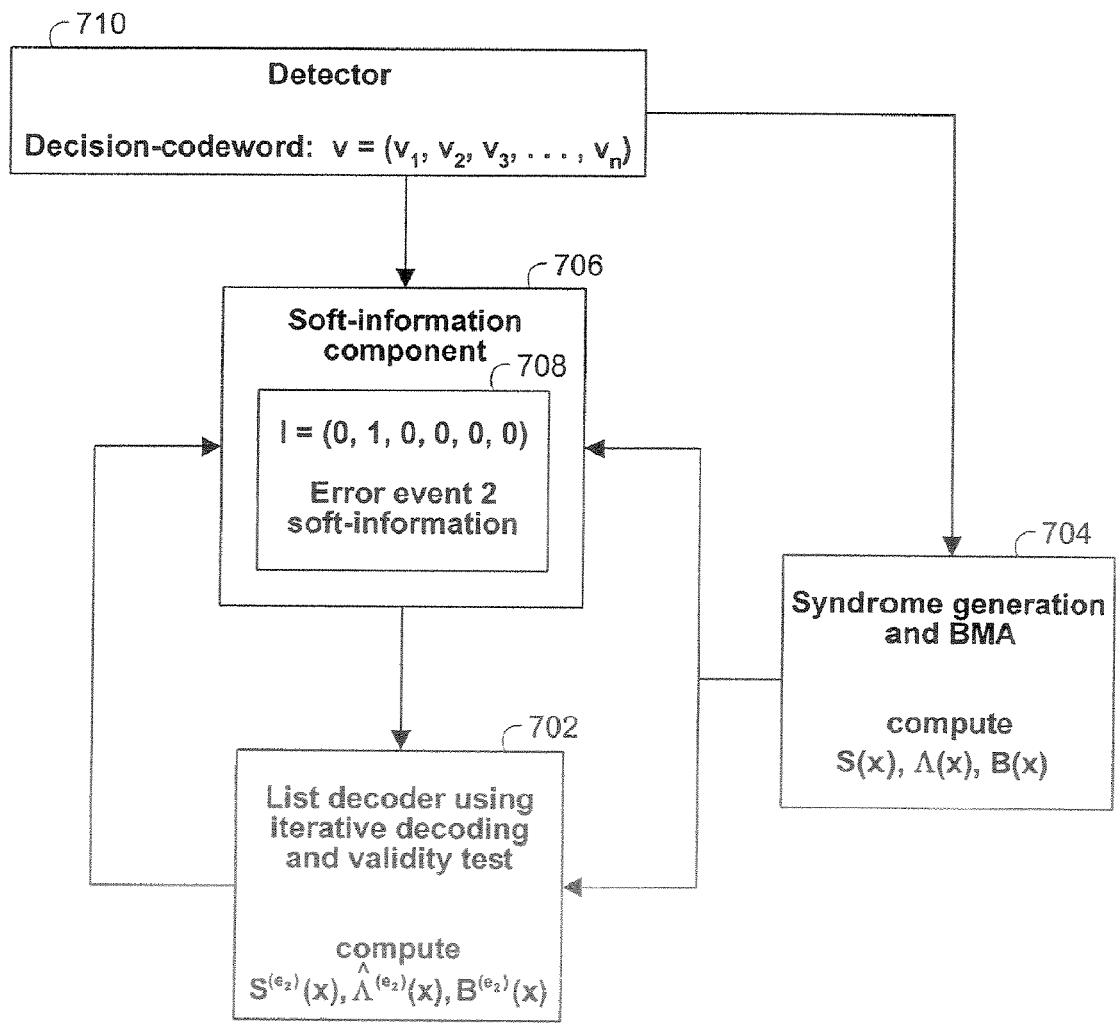
FIG. 7 is an block diagram of using iterative decoding to generate new error indicators.

FIG. 7 illustrates one configuration for using incidence vectors with a list decoder 702 that utilizes iterative decoding and the validity test. As shown in FIG. 7, a decision-codeword v having n symbols $v_0, \ldots, v_{n-1}$ can be provided to a BMA component 704 and a soft-information component 706. The BMA component 704 can generate syndromes S(x), an error locator polynomial Λ(x), and a scratch polynomial B(x), based on the decision-codeword v. The triplet of error indicators (Λ(x), B(x), S(x)) can be stored in a memory 708 within the soft-information component 706, in the list decoder 702, and/or in another memory (not shown). Although it is assumed that the decision-codeword contains more than t errors, in practice that determination can be made by a Chien search either before or after list decoding.

The soft-information component 706 can receive the decision-codeword and soft-information related to the decision-codeword from a detector 710 and can direct the list decoder 702 to process modified decision-codewords. To do this, the soft-information component can select an incidence vector I from the soft-information component memory 708. In one embodiment, the initial incidence vector that is selected includes only one error event, such as an error event l=2. This single-error event corresponds to the incidence vector I=(0, 1,0,0,0,0) shown the illustration. The incidence vector can be associated with a triplet of error indicators (Λ(x), B(x), S(x)), which can be stored in the memory 708, in the list decoder 702, and/or provided by the BMA component 704. The soft-information component 706 can communicate the error indicator triplet and soft information related to the incidence vector I=(0,1,0,0,0,0) to the list decoder 702. In the illustrated embodiment, the incidence vector corresponds to error event two, so the soft-information component 706 can communicate soft-information related error event two to the list decoder 702. The list decoder 702 can process its received information using iterative decoding and the validity test to produce new error indicators corresponding to the incidence vector. In the illustrated example, since the error event that is corrected is l=2, the list decoder 702 can produce the new error indicator triplet $(\hat{\Lambda}^{(e_2)}, B^{(e_2)}(x), S^{(e_2)})$. This error indicator triplet can be communicated to the soft-information component 706 and stored in the memory 708 or can be stored within the list decoder 702, for use with a subsequent iterative decoding iteration. In one embodiment, if the error indicator triplet passed the validity test, the triplet can be stored in a designated area in the memory 708 to await processing by a Chien search. From hereon, it will be assumed that error indicator triplets are stored within the list decoder 702. Additionally, for error indicator triplets that pass the validity test, a copy of such error indicator triplets are also stored in the soft-information component memory 708.

Figure 8:
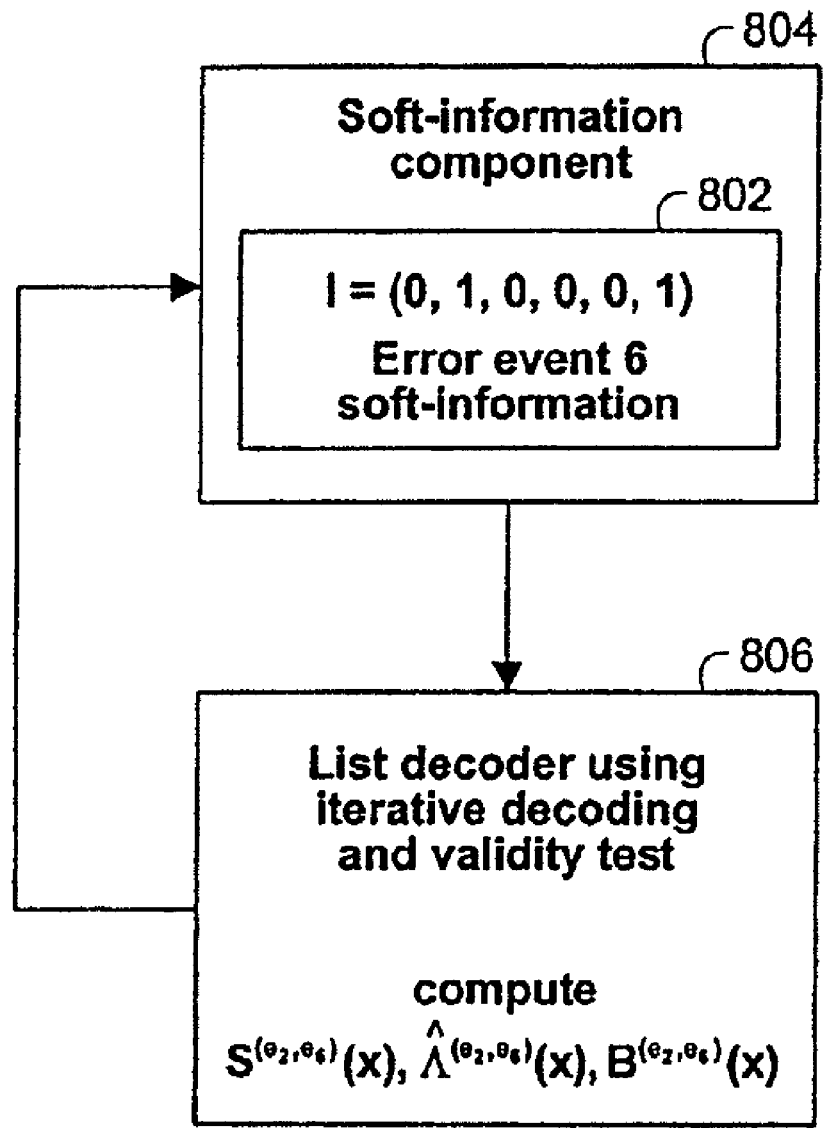
FIG. 8 is another block diagram of using iterative decoding to generate new error indicators.

Shown in FIG. 8 is an iterative decoding iteration in the list decoder immediately after the iteration of FIG. 7. The detector 710 and syndrome generation and BMA component 704 of FIG. 7 are not shown because they are not involved with iterative decoding after the initial iterative decoding iteration. After the iteration of FIG. 7, the error indicator triplet ($\hat{\Lambda}^{(e_2)}$, $B^{(e_2)}(x), S^{(e_2)}$) stored in the list decoder 806. The soft-information component 804 can select another incidence vector for iterative decoding. In the illustrated example, the soft-information component 804 selects an incidence vector I=(0, 1,0,0,0,1). Since error event l=2 was already corrected in FIG. 7, the error event that remains to be corrected is error event l=6. Accordingly, the soft-information component 804 can communicate soft-information related to error event l=6 to the list decoder 806 for iterative decoding and the validity test. Based on this soft-information and the previous triplet ($\hat{\Lambda}^{(e_2)}, B^{(e_2)}(x), S^{(e_2)}$), the list decoder can generate a new error indicator triplet ($\hat{\Lambda}^{(e_2,e_6)}(x), B^{(e_2,e_6)}(x), S^{(e_2,e_6)}$)). As before, this new triplet can be stored in the list decoder depending on whether it is needed for a subsequent iterative decoding iteration. If the new triplet passed the validity test, a copy can also be stored in the soft-information component memory 802.

In one embodiment and with reference to FIG. 7, the order in which incidence vectors are processed by a list decoder 702 can be pre-determined. The processing order can be controlled by a soft-information component and can be configured in a way that reduces the amount of memory in the list decoder 702 that is needed to store error indicator triplets ($\hat{\Lambda}^{(e_l, \cdots)}(x), B^{(e_l, \cdots)}(x), S^{(e_l, \cdots)}(x)$) for use in iterative decoding. In one embodiment, the processing order can be configured based on various heuristic guidelines, such as those described below. An incidence vector whose resulting error indicators are used by a subsequent incidence vector is referred to herein as a "parent," and the subsequent incidence vector is referred to herein as a "child."

Guidelines:
(1) At least a few incidence vectors having one error event should be ordered first, but not all single-error incidence vectors need to be computed first;
(2) Among incidence vectors having the same number of error events, incidence vectors that do not need to be used in any subsequent iterative decoding iteration should be ordered earlier;
(3) Incidence vectors whose child combinations require least storage should be ordered earlier;
(4) If incidence vectors are processed in a pipeline architecture and each incidence vector requires k pipeline stages, then any children of an incidence vector must be ordered at least k time slots later than the parent; and
(5) Achieve a substantially similar number of child incidence vectors for each parent incidence vector.

Since the results of incidence vectors that have no children are not needed for subsequent iterative decoding iterations, ordering incidence vectors based on guideline (2) can reduce the amount of memory needed for iterative decoding. In one embodiment, each incidence vector can be associated with an indicator that indicates whether the error indicators associated with an incidence vector need to be stored in memory.

Table one below shows an exemplary ordering of incidence vectors that only requires memory for four error indicator triplets in connection with iterative decoding. In table one, six error events are designated as e1 to e6, and the four memory locations are designated as r1 to r4. A separator "|" is used to indicate error event(s) that have been corrected (left side of the separator) and an error event that is being corrected (right side of the separator). As an example, an incidence vector I=(1,0,0,0,0,0) whose result is stored in memory location "one" is indicated as (e1)$_{r1}$, and an incidence vector I=(0,1, 0,1,0,0) whose result is not stored is indicated by [e4|e2]. In the latter example, a resulting error indicator triplet ($\hat{\Lambda}^{(e_4,e_2)}(x), B^{(e_4,e_2)}(x), S^{(e_4,e_2)}(x)$)) may be stored in soft-information component memory 708 if it passes the validity test, but it is not stored in the list decoder 702 for use in subsequent iterative decoding iterations.

TABLE 1

| Order | Incidence vector |
|---|---|
| 1 | (e1)$_{r1}$ |
| 2 | (e2)$_{r2}$ |
| 3 | (e4)$_{r3}$ |
| 4 | (e1 | e2)$_{r1}$ |
| 5 | (e2 | e3)$_{r2}$ |
| 6 | [e4 | e2] |
| 7 | [e4 | e3] |
| 8 | (e4 | e1)$_{r3}$ |
| 9 | [e1 + e2 | e6] |
| 10 | [e4 + e1 | e2] |
| 11 | [e4 + e1 | e3] |
| 12 | (e3)$_{r3}$ |
| 13 | [e1 + e2 | e3] |
| 14 | (e3 | e1)$_{r3}$ |
| 15 | (e1 + e2 | e5)$_{r1}$ |
| 16 | [e2 + e3 | e6] |
| 17 | [e1 + e2 + e5 | e3] |
| . |  |
| . |  |
| . |  |

Table one shows an ordering of seventeen incidence vectors out of a total of sixty-three. The particular ordering and memory arrangement are exemplary and other variations are contemplated.

Figure 9:
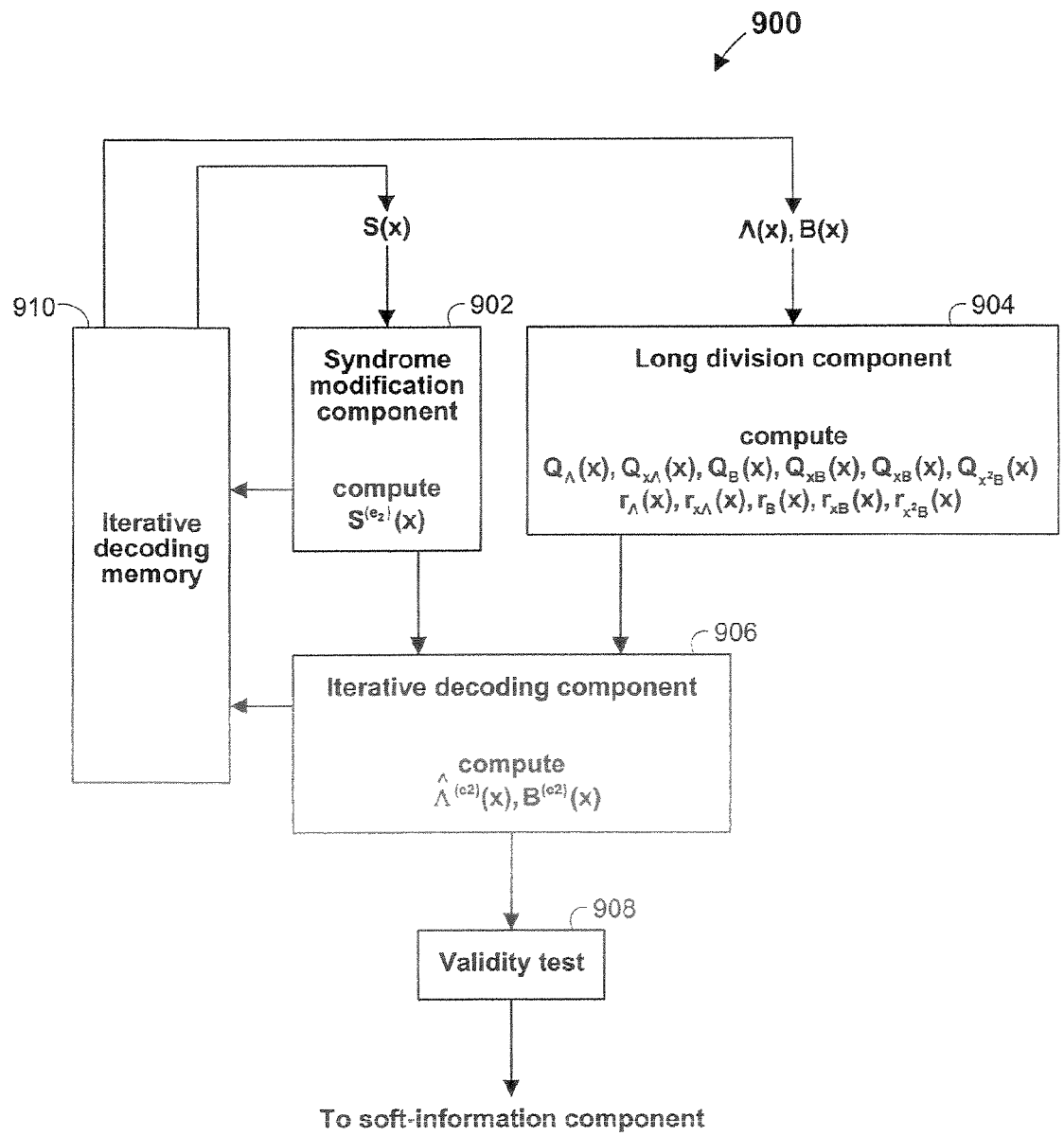
FIG. 9 is a block diagram of the components of an exemplary list decoder employing list decoding and the validity test.

Referring now to FIG. 9, there is shown a block diagram of exemplary components in a list decoder 900. In accordance with the iterative decoding algorithm described in the Burd reference and above herein, a list decoder can include a syndrome modification component 902, a long division component 904, an iterative decoding component 906, a validity test component 908, and an iterative decoding memory 910. The iterative decoding memory 910 can store one or more error indicator triplets and can provide the triplets to the other components. In the illustration of FIG. 9, the iterative decoding memory 910 provides a syndrome polynomial S(x) to the syndrome modification component 902 and provides an error locator polynomial $\Lambda(x)$ and a scratch polynomial B(x) to the long division component 904.

In the illustration of FIG. 9, it is assumed that error event two has been processed and the task is to generate new error indicators corresponding to error event two. The syndrome modification component 902 can produce syndromes for a modified decision-codeword using previously computed syndromes from another (modified) decision-codeword. The syndrome modification component 902 produces syndromes for a modified decision-codeword in which error event two is corrected. The modified syndromes $S^{(e_2)}(x)$ can be produced based on existing syndromes S(x) for a decision-codeword. The long division component 904 prepares intermediate polynomials and/or values that are used to compute new error indicators. The intermediate polynomials can include quotient polynomials $Q_A(x), Q_{xA}(x), Q_B(x), Q_{xB}(x)$, and $Q_{x^2B}(x)$ and/or remainder values $r_A, r_{xA}, r_B, r_{xB}, r_{x^2B}$, as described in the Burd reference. Since error event two has been processed, the divisor in the long division component 904 is a polynomial $(x+a^{-j_2})$. The exponent $-j_2$ in the divisor polynomial indicates that the symbol at position $j_2$, corresponding to error event l=2, was corrected. The modified syndromes $S^{(e_2)}(x)$ and the intermediate polynomials/values can be used by the iterative decoding component 906 to compute a new error locator polynomial $\hat{\Lambda}^{(e_2)}(x)$ and a new scratch polynomial $B^{(e_2)}(x)$, as described herein and in the Burd reference. A validity test component 908 can then predict the validity of the new error locator polynomial $\hat{\Lambda}^{(e_2)}(x)$. If the validity test component 908 predicts that the new error indicators are valid, the new error indicators can be communicated to a soft-information component where they can be stored in a memory. To confirm the validity of the validity test component's prediction, a Chien search component (not shown) can process the error indicators that were predicted to be valid to verify their validity.

With continuing reference to FIG. 9, the illustrated configuration is an example of one embodiment of a list decoder that is suitable for implementation as a pipeline architecture. The four discrete operations—syndrome modification 902, long division 904, new error indicator computation 906, and validity test 908—can be implemented as a pipeline architecture that can increase the throughput of incidence vectors through a list decoder. The particular throughput that can be achieved depends on a number of factors, including the number of pipeline stages, the amount hardware resources that is allotted to each pipeline stage, and the length of the computing interval.

Figure 10:
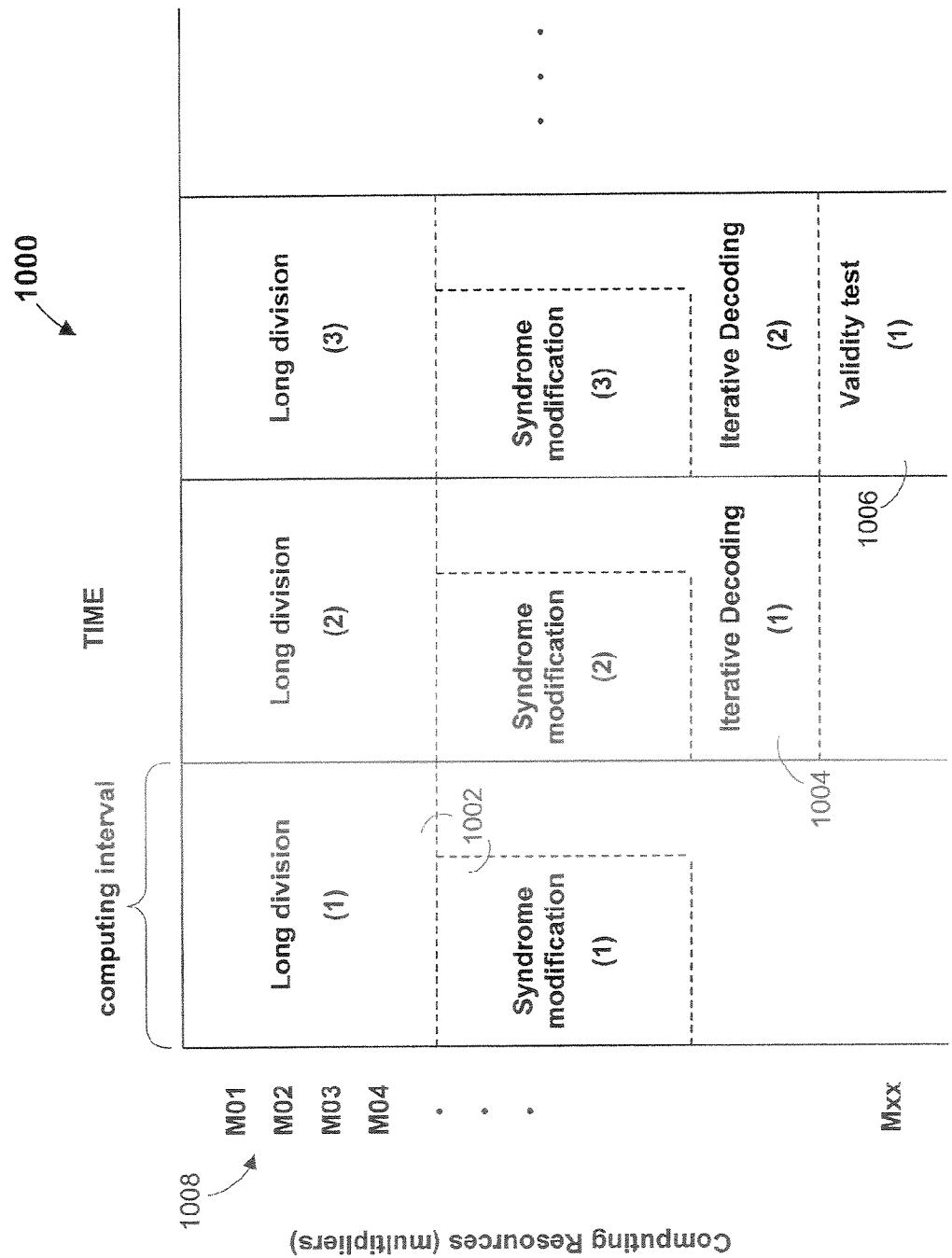
FIG. 10 is a graph of the progression of processing through an exemplary pipelined list decoder.

FIG. 10 shows an exemplary graph 1000 that traces the processing of incidence vectors through a pipelined list decoder architecture having three pipeline stages. The first stage of the pipeline performs syndrome modification and long division 1002, the second stage computes new error indicators 1004, and the final stage performs the validity test 1006. As shown in the illustration, each stage can be associated with hardware resources 1008 such as multipliers Mxx. Initially, the first pipeline stage 1002 can process a first incidence vector during a computing interval. In the illustrated embodiment, the long division operation and the syndrome modification operations are associated with different resources and can operate concurrently. The results of the long division and syndrome modification operations 1002 can be communicated to the second pipeline stage 1004. At the beginning of the next computing interval, the first pipeline stage can process a second incidence vector, while the second pipeline stage 1004 computes new error indicators based on the results from the first pipeline stage. In the illustrated embodiment, the syndrome modification operation completes its computation before the end of a computation interval. Rather than allowing the syndrome modification resources to remain idle for the remainder of the computation interval, they can be used by another pipeline stage to perform its computations. In the illustrated example, the computing resources associated with the syndrome modification operation are used to compute new error indicators once the syndrome modification computations are completed. Then, once the new error indicators are computed, they can be communicated to the validity test pipeline stage 1006.

The particular time and resource allocation in FIG. 10 is exemplary and variations are possible and contemplated. For example, the syndrome modification and long division operations 1002 can occur in different pipe stages. Also, the validity test 1006 can be performed in the same pipeline stage as the iterative decoding stage 1004. Additionally, the operations of an illustrated component can be separated into two or more pipeline stages. For example, the iterative decoding operation 1004 can be separated into a first pipeline stage that computes the values a, b, and c in equation EQ7 and a second pipeline stage that computes the new error indicator polynomials in equations EQ8 and EQ9. Accordingly, the number of pipeline stages can vary between two and four but can also be another number.

The following detailed description will now describe exemplary implementations of the list decoding components and operations described thus far herein. In particular, FIGS. 11-12 relate to circuitry for performing syndrome modification, and FIGS. 13-14 relate to circuitry for performing long division.

Figure 11:
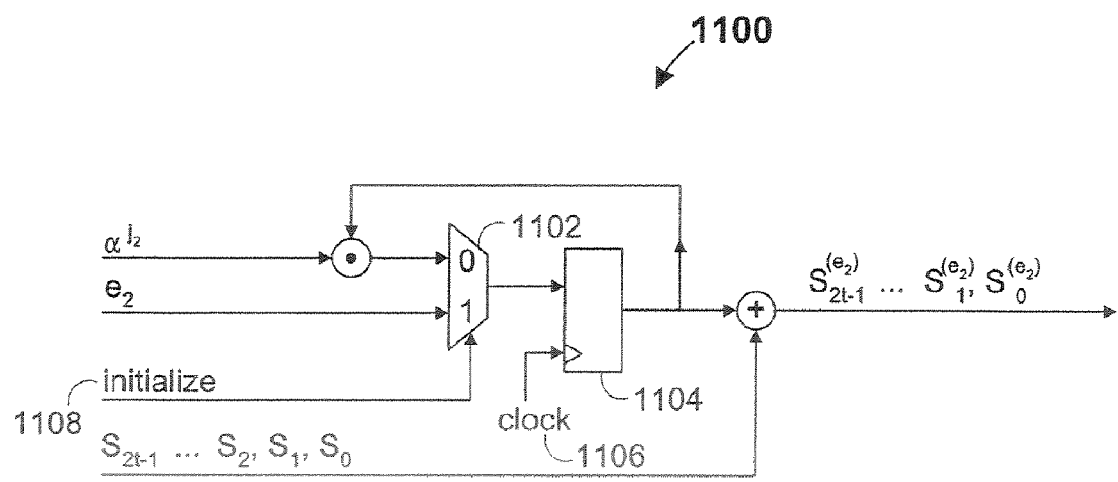
FIG. 11 is a circuit diagram of a serial syndrome modification circuit.

Referring to FIG. 11, there is shown a circuit 1100 that recursively computes modified syndromes $S^{(e_2)}(x)$ based on previously computed syndromes $S(x)$ for a decision-codeword. In the illustrated scenario, the modified syndromes correspond to a modified decision-codeword in which error event l=2 is corrected. The particular error event that is corrected is merely exemplary, and the illustrated circuit 1100 can be used to produce modified syndromes in connection with other error events.

As described in the Burd reference, modified syndromes can be produced using the equation $$S_i^{(el)} = S_i + e_l a^{jli},$$  (EQ18)

where l is the number of the error event that is corrected, and i corresponds to a particular syndrome. For an exemplary error event l=2, the syndromes are $$S_0^{e2} = S_0 + e_2 a^0,$$

$$S_1^{e2} = S_1 + e_2 a^{j_2},$$

$$S_2^{e2} = S_2 + e_2 a^{2j_2},$$

$$S_3^{e2} = S_3 + e_2 a^{3j_2},$$

$$\vdots$$

and so on. The previously computed syndromes $S_i$, the error value $e_2$, symbol location $j_2$, and primitive element a can be stored in a soft-information component memory. Thus, the only quantities that need to be computed are the terms $e_2 a^{i \cdot j_2}$, i=0, ..., (2t−l+Δ). The circuit 1100 of FIG. 11 computes these terms recursively by starting at iteration i=0 with an initial term $e_2$. In each subsequent iteration i>0, the circuit 1100 can multiply the term from the previous iteration by a factor $a^{j_2}$, thereby adding $j_2$ to the exponent of a in each iteration to produce the terms $e_2 a^{j_2}$, $e_2 a^{2j_2}$, $e_2 a^{3j_2}$, and so on. The term $e_2 a^{i \cdot j_2}$ in each iteration is then added to previously computed syndrome $S_i$ to produce $S_i^{(e_2)} = S_i + e_2 a^{i \cdot j_2}$.

The recursive computation of $e_2 a^{i \cdot j_2}$ is implemented by a two-input multiplexor 1102 and a timing component 1104. The timing component 1104 can be timed by a clock signal 1106. In the first iteration i=0, an initialize signal 1108 can assume a value of "one," which can enable the multiplexor 1102 to select the initial term $e_2$. This initial term can be communicated to the timing component 1104. In one embodiment, the timing component 1104 can store the value on its input connection until it receives an indication from the clock signal 1106 that indicates the beginning of another iteration, at which point the timing component 1106 can communicate its stored value to its output connection. In one embodiment, such an indication can be a rising clock edge. Starting from the second iteration i=1, the initialize signal 1108 can assume a value of "zero," which can cause the multiplexor 1102 to select its recursive input. As shown in the illustration, the recursive input value is the product of the timing component output value with the factor $a^{j_2}$. At the beginning of each iteration, the value at the timing component output can also be added to a previously computed syndrome to produce the corresponding modified syndrome.

Figure 12:
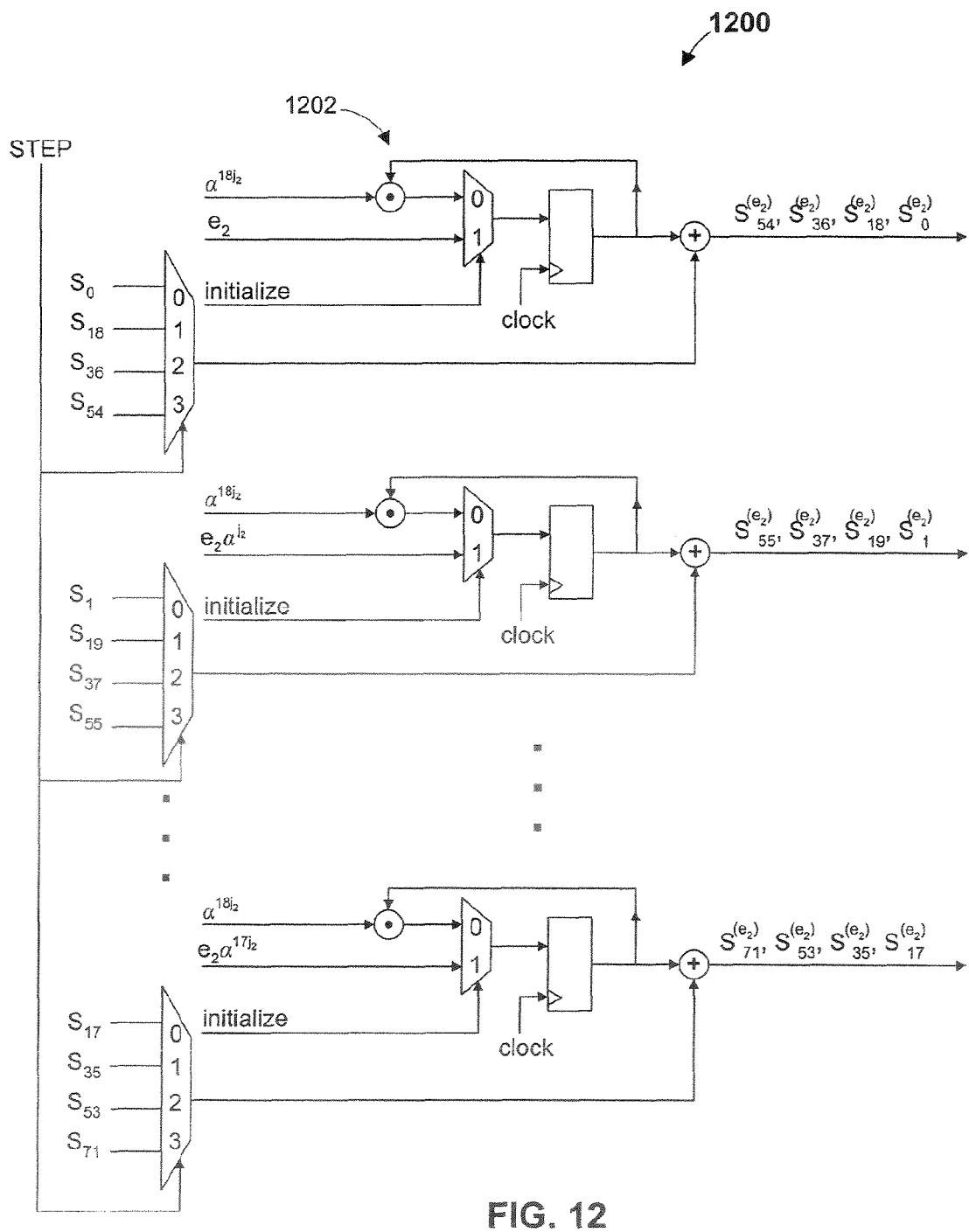
FIG. 12 is a diagram of multiple syndrome modification circuits operating in parallel.

The syndrome modification circuit 1100 of FIG. 11 computes syndromes recursively over 2t iterations. In one embodiment, the number of iterations required for syndrome modification can be decreased by using multiple copies of the circuit 1100 of FIG. 11. FIG. 12 shows one example of a syndrome modification system 1200 that uses eighteen copies of the circuit 1100 of FIG. 11. Assume that the number of syndromes that need to be computed is seventy-two. In this scenario, each of the eighteen circuits can be responsible for producing 72/18=4 syndromes. Accordingly, the number of iterations needed to produce all of the modified syndromes is also four. The first circuit 1202 can produce modified syndromes $S_0^{(e2)}$, $S_{18}^{(e2)}$, $S_{36}^{(e2)}$, and $S_{54}^{(e2)}$. The initial term produced by the first circuit 1202 in the first iteration is $e_2 a^{0 \cdot j_2}$, which corresponds to $S_0^{(e2)}$. In each of the subsequent iterations, the circuit 1202 can recursively multiply the term from the previous iteration by a factor $a^{18 j_2}$, thereby producing the terms $e_2 a^{0 j_2}$, $e_2 a^{18 j_2}$, $e_2 a^{36 j_2}$, and $e_2 a^{54 j_2}$ in four iterations. In the other seventeen copies of the syndrome modification circuit, the initial terms can be $e_2 a^{i \cdot j_2}$, where each circuit can be assigned one value from i=1, 2, . . . , 17. The recursion multiplier factor for each of the syndrome modification circuits is the same $a^{18 j_2}$ term. In the illustrated embodiment, the previous syndromes $S_i$ can be connected to the syndrome modification circuits by multiplexors that are controlled by a STEP signal. The number of multiplexor inputs depends on the number of syndromes that need to be computed and the number of parallel computation circuits. The parallel syndrome modification system 1200 of FIG. 12 is exemplary and variations in the number of parallel circuits and/or the assignment of syndromes to circuits are contemplated. The particular devices and connections and their configuration are also exemplary, and other devices, connections, and configurations are possible.

Figure 13:
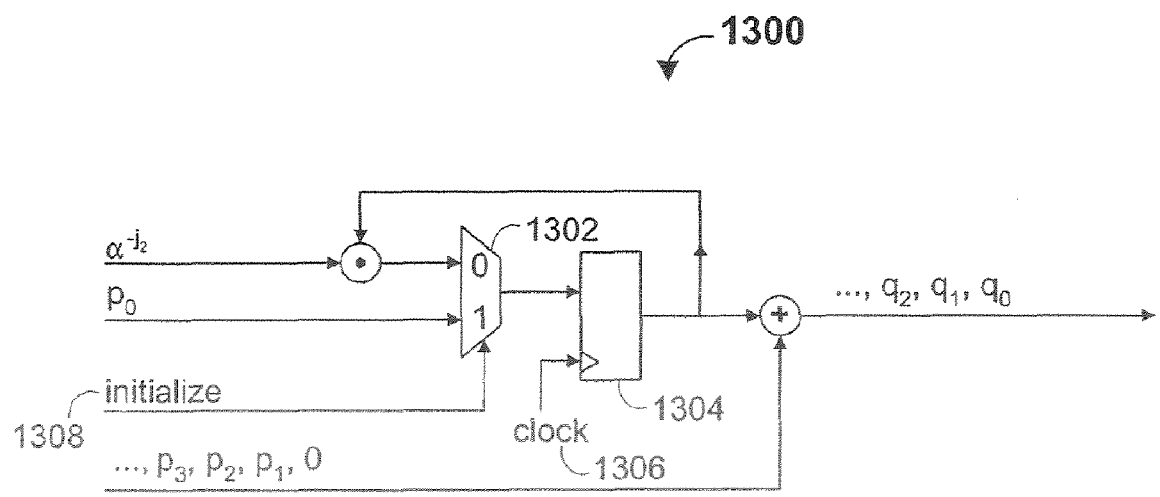
FIG. 13 is a circuit diagram of a serial long division circuit.

Referring now to FIG. 13, there is shown a circuit 1300 for implementing the long division operations in iterative decoding. The divisor term in the long division operations have the form $(x + a^{-j_l})$, where $j_l$ corresponds to a symbol position of an error event l. For the following description of long division, it will be assumed that error event l=2 is being corrected, which corresponds to symbol position $j_2$.

In one embodiment, computing the quotient and remainder polynomials can involve two division computations $$\frac{\Lambda(x)}{(x + \alpha^{-j_2})} \text{ and } \frac{B(x)}{(x + \alpha^{-j_2})},$$

which provide quotient polynomials $Q_A(x)$ and $Q_B(x)$, respectively, and remainder values $r_A$ and $r_B$, respectively. The remainders are numerical values rather than polynomials because the divisor is a first degree polynomial. These results can be used to obtain the other quotients and remainders as follows:

$$Q_{xA}(x) = x Q_A(x) + r_A \tag{EQ19}$$

$$r_{xA} = r_A a^{-j_2}, \tag{EQ20}$$

$$Q_{xB}(x) = x Q_B(x) + r_B, \tag{EQ21}$$

$$r_{xB} = r_B a^{-j_2}, \tag{EQ22}$$

$$Q_{x^2 B}(x) = x Q_{xB}(x) + r_{xB}, \tag{EQ23}$$

$$r_{x^2 B} = r_{xB} a^{-j_2}. \tag{EQ24}$$

Among these computations, the most complex computations involve determining the coefficients of quotient polynomials $Q_A(x)$ and $Q_B(x)$. These computations can be performed based on the following observations. In general terms, suppose that we want to divide $$P(x) = p_0 x^t + p_1 x^{t-1} + p_2 x^{t-2} + \ldots + p_{t-1} x + p_t$$

by $(x + a^{-j})$. Let the quotient polynomial be $$Q(x) = q_0 x^{t-1} + q_1 x^{t-2} + \ldots + q_{t-2} x + q_{t-1},$$

and let r be the remainder. Because the divisor polynomial $(x + a^{-j})$ has degree one, the relationship between the polynomials becomes $P(x) = Q(x) x + Q(x) a^{-j} + r$. This means that the following recursion equation can be used to determine the coefficients of $Q(x)$ and r:

$$q_i = p_i + q_{i-1} a^{-j}, \text{ for } 1 \leq i \leq t-1, \tag{EQ25}$$

where initially $q_0 = p_0$, and the remainder is $r = p_t + q_{t-1} a^{-j}$. The circuit 1300 of FIG. 13 is an implementation of equation EQ25 and can be used to compute $Q_A(x)$ and $r_A$, and $Q_B(x)$ and $r_B$, by substituting $\Lambda(x)$ and $B(x)$, respectively, for $P(x)$. Initially, at iteration i=0, the multiplexor 1302 can select term $p_0$ so that $q_0 = p_0$. For iterations i>0, the multiplexor 1302 can select the recursive input to generate coefficients $q_i = p_i + q_{i-1} a^{-j_2}$.

Figure 14:
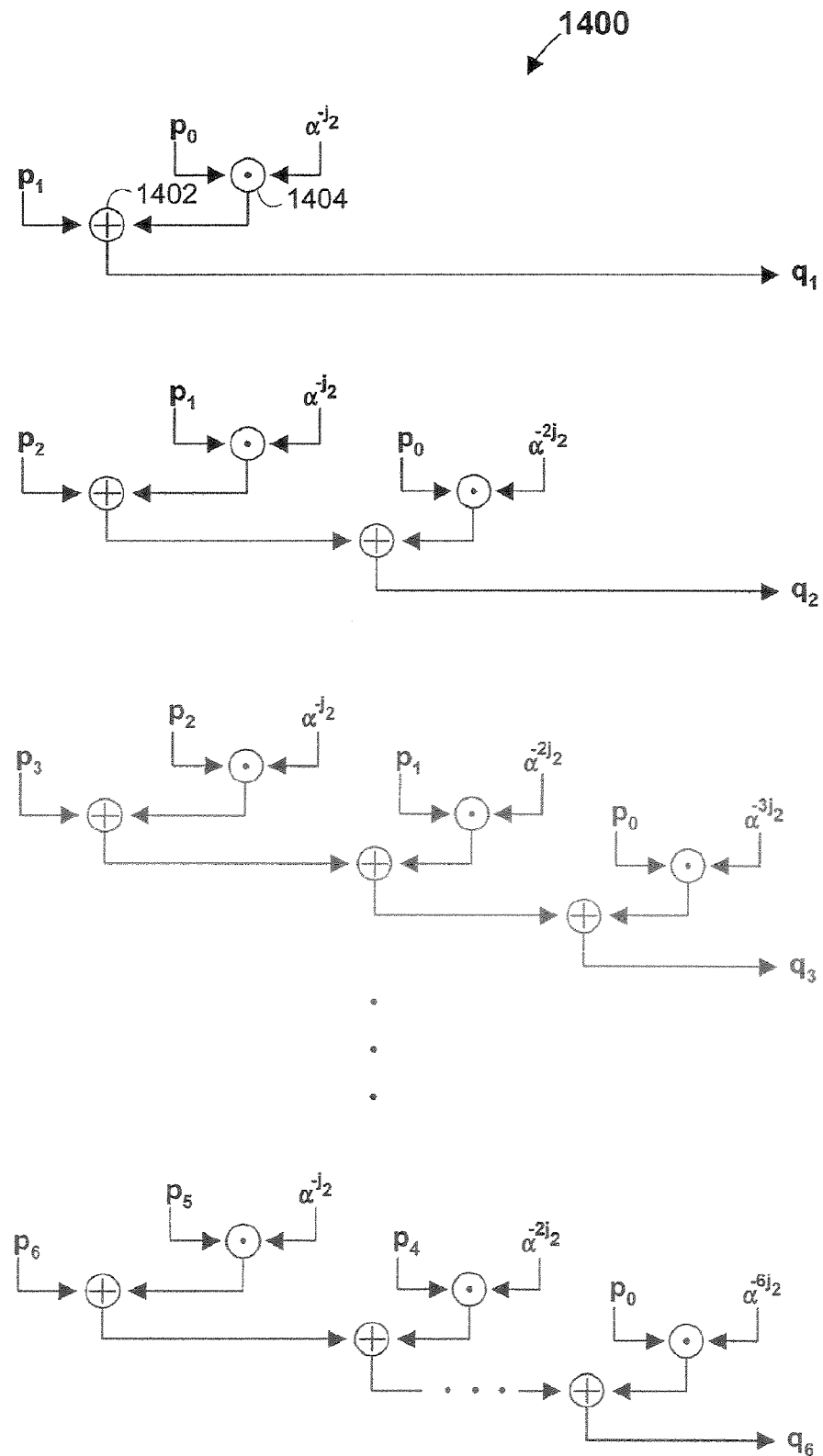
FIG. 14 is a diagram of circuitry for computing multiple quotient coefficients in parallel in a long division operation.

Since the degrees of $\Lambda(x)$ and $B(x)$ are approximately t, using the recursive circuit 1300 of FIG. 13 to compute the quotient coefficients can require about t iterations. In one embodiment, the number of iterations can be reduced by computing several coefficients in parallel. For example, as shown in FIG. 14, rather than iterating equation EQ25 for six iterations to obtain coefficients $q_1, q_2, \ldots, q_6$, these quotient coefficients can be directly computed based on $p_0$ and $p_1, \ldots, p_6$ as follows:

$$q_1 = p_1 + p_0 a^{-j}, \tag{EQ26}$$

$$q_2 = p_2 + p_1 a^{-j} + p_0 a^{-2j}, \tag{EQ27}$$

$$q_3 = p_3 + p_2 a^{-j} + p_1 a^{-2j} + p_0 a^{-3j}, \tag{EQ28}$$

$$q_4 = p_4 + p_3 a^{-j} + p_2 a^{-2j} + p_1 a^{-3j} + p_0 a^{-4j}, \tag{EQ29}$$

$$q_5 = p_5 + p_4 a^{-j} + p_3 a^{-2j} + p_2 a^{-3j} + p_1 a^{-4j} + p_0 a^{-5j}, \tag{EQ30}$$

$$q_6 = p_6 + p_5 a^{-j} + p_4 a^{-2j} + p_3 a^{-3j} + p_2 a^{-4j} + p_1 a^{-5j} + p_0 a^{-6j}. \tag{EQ31}$$

In this example, the implementation allows six quotient coefficients to be computed in parallel, but still requires recursion to compute quotient coefficients beyond the initial six. However, each subsequent iteration can also compute six coefficients in parallel. Specifically, after $q_1, \ldots, q_6$ are computed, the next iteration can compute $q_7, \ldots, q_{12}$ by setting $p_0$ equal to $q_6$ and replacing $p_1, \ldots, p_6$ with $p_7$, respectively. In this manner, the number of iterations needed to compute quotient coefficients in a long division operation can be reduced by six. FIG. 14 shows a system 1400 that implements equations EQ26 to EQ31. The adders 1402 in FIG. 14 can be bit-wise XOR logic, and the multipliers 1404 can perform multiplication defined over a finite field. The number of quotient coefficients that are computed in parallel can vary and need not be six. In general, for a system that computes w quotient coefficients in parallel, the number of iterations needed is approximately t/w.

Figure 15:
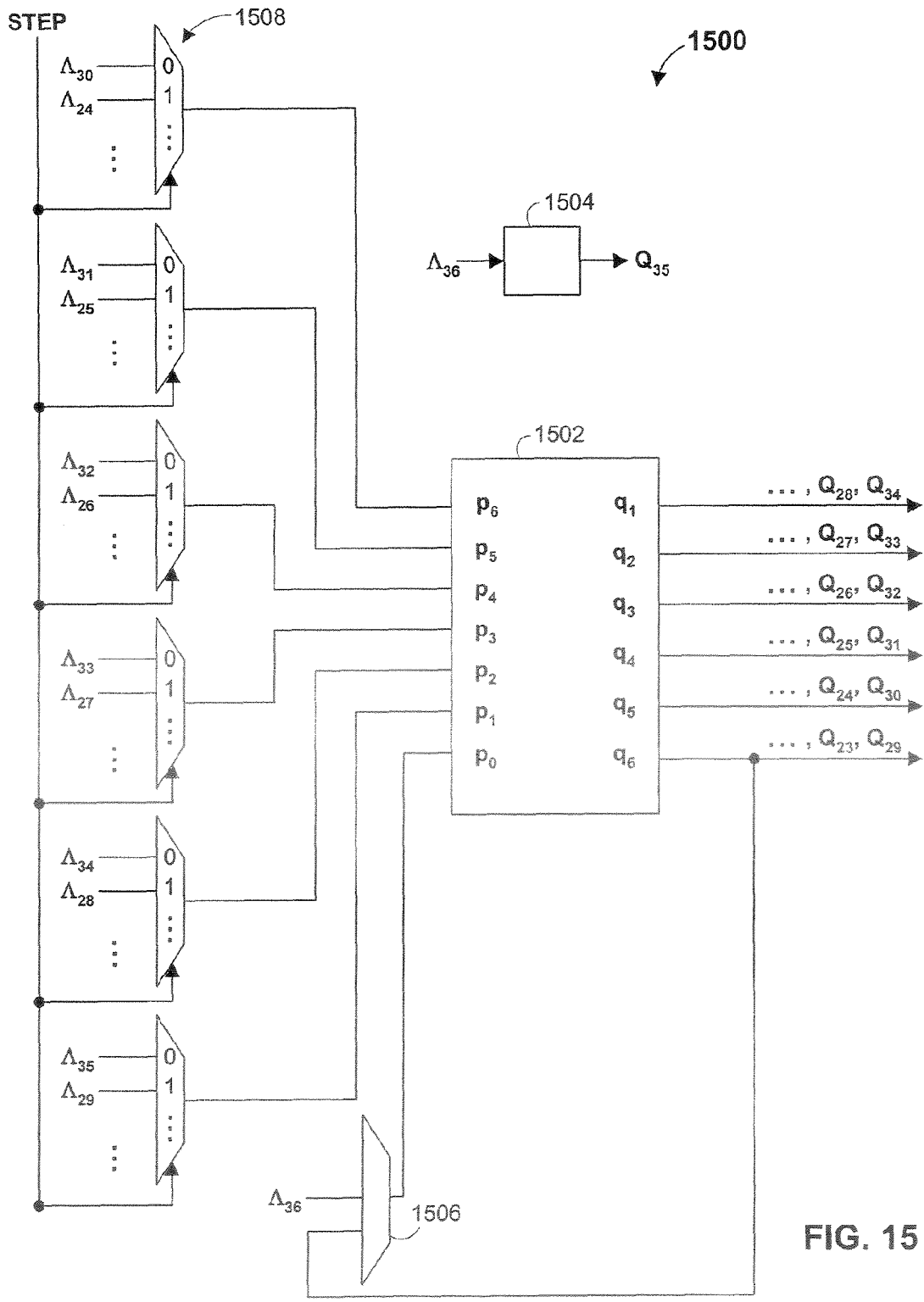
FIG. 15 is a diagram of circuitry for selecting correct input values to use in a long division operation.

FIG. 15 shows a system 1500 in which the computation logic of FIG. 14 is contained in a parallel computation component 1502. Assuming that $\deg(\Lambda(x)) = 36$, then thirty-six quotient coefficients, $(Q_\Lambda)_0, \ldots, (Q_\Lambda)_{35}$, need to be computed. The coefficient $(Q_\Lambda)_{35}$ can be produced using a latch 1504 and need not be computed. The other coefficients can be computed in groups of six in accordance with FIG. 14. In the first iteration, the input $p_0$ is set to $\Lambda_{36}$ by a multiplexor 1506. The multiplexors 1508 at inputs $p_1$ to $p_6$ can select the first inputs based on a STEP signal. In subsequent iterations, $p_0$ is set equal to the value of output $q_6$, and the STEP signal causes the multiplexors 1508 at inputs $p_1$ to $p_6$ to select their subsequent input values. In this manner, the quotient coefficients are computed in parallel.

Figure 16:
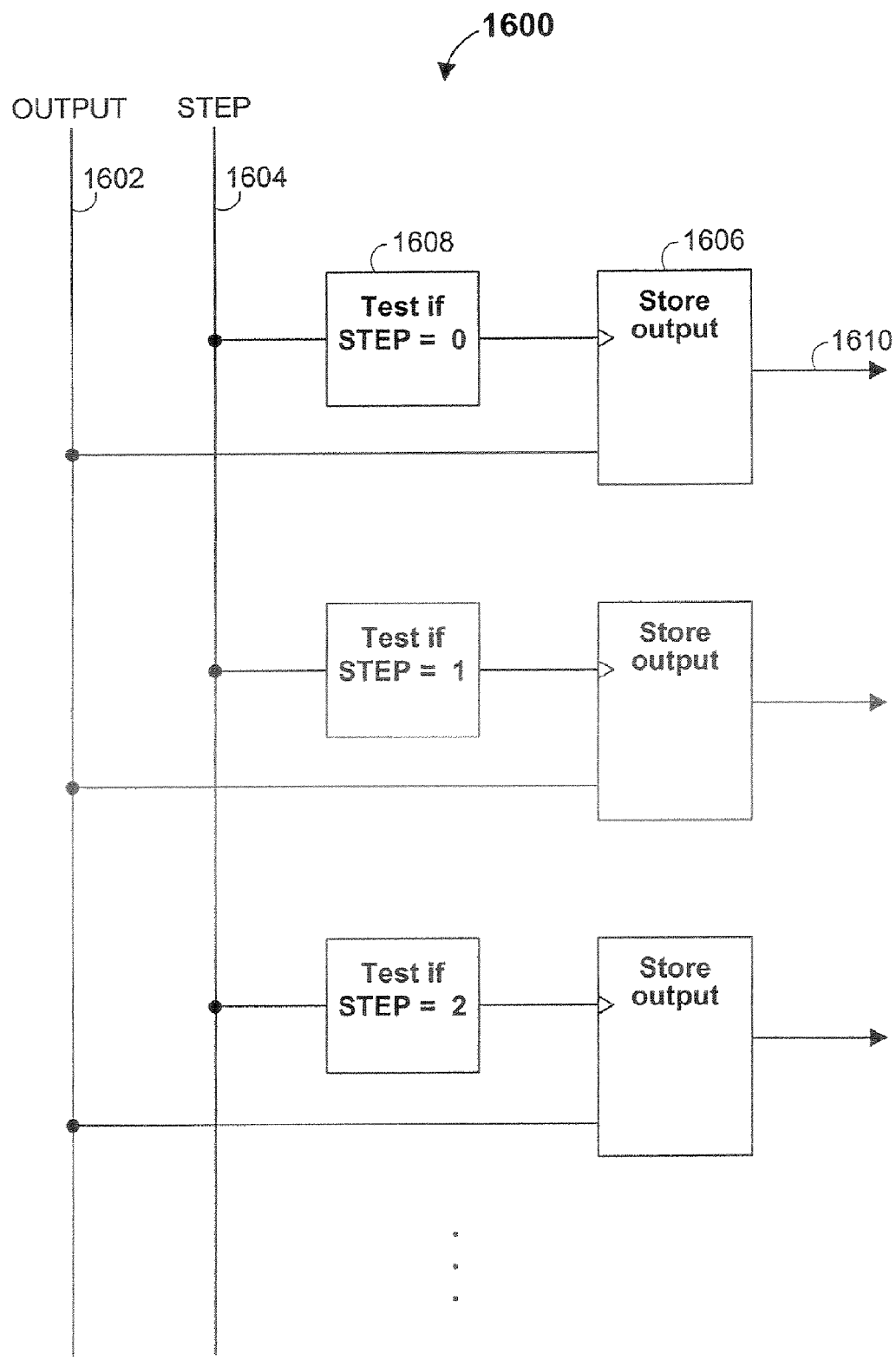
FIG. 16 is a diagram of circuitry for storing values on an output connection based on a STEP signal.

Referring again to FIGS. 12 and 15, the syndrome and long division computations are performed over several iterations. The outputs of the circuits are different for each iteration. Referring now to FIG. 16, there is shown a system 1600 for storing output values, from a single output connection 1602, that are generated over several iterations, such as the circuits of FIGS. 12 and 15. The different iterations can be indicated by a STEP signal 1604, such as the same STEP signal in FIGS. 12 and 15. In general, assume that there are a number m of iterations and that the STEP signal can assume the values 0, 1, . . . , (m−1). In the illustrated embodiment, there is a storage element 1606 and an iteration identification element 1608 corresponding to each of the m iterations. Each storage element 1606 can be in communication with the output connection 1602 that carries the output values to be stored. Each iteration identification element 1608 can be in communication with the STEP signal 1604 and can compare the value of the STEP signal to an internally stored value. When the STEP signal 1604 equals an iteration identification element's internal value 1608, the iteration identification element 1608 can direct its corresponding storage element 1606 to store the value on the output connection 1602. In this manner, the m different output values on the output connection 1602 can be stored in m different storage elements. For example, in the syndrome modification circuit 1200 of FIG. 12, there are four iterations and m=4. The first modification circuit corresponds to the four output values $S_0^{(e2)}$, $S_{18}^{(e2)}$, $S_{36}^{(e2)}$, and $S_{54}^{(e2)}$. Using the storage system 1600 of FIG. 16, the four modified syndromes can be stored in four different storage elements 1606. The storage element output 1610 of each storage element 1606 can be connected to a subsequent computation component, such as an iterative decoding component.

Accordingly, what have been described thus far in FIGS. 11-15 include systems and methods for performing syndrome modification (FIGS. 11-12) and long division (FIGS. 13-15). After the syndrome modification and long division operations are complete, their results can be used in equations EQ14 to EQ15 to compute the values $d_1$, $d_2$, $d_3$, and/or $d_4$. These results can then be used to compute the values a, b, and c, as shown in equation EQ7 (for case two). The corresponding values a, b, and c, for case one are shown below for convenience:

$$a = (r_\Lambda d_3 + r_{xB} d_1) D^{-1} \tag{EQ32}$$

$$b = \begin{cases} (d_1 + ad_2) d_3^{-1} & \text{if } d_3 \neq 0 \\ (r_\Lambda + ar_{x\Lambda}) r_{xB}^{-1} & \text{otherwise} \end{cases}$$

$$c = r_\Lambda r_B^{-1}.$$

The computations of scalars a, b, and other intermediate values include common sub-computations. In one embodiment the sub-computations can be interleaved and performed in a progressive, step-wise manner that allows intermediate results of one step to be used by subsequent steps. This interleaved approach can reduce the amount of time and/or resources needed to compute the new error indicators. One example of an interleaved computation of values a and b for case one is shown in the table below. The computations assume that the values $d_1$, $d_2$, and $d_3$ have already been computed in accordance with equations EQ14-EQ15. The example below limits the number of multiplications or inversions in each intermediate computation to either two multiplications or to one multiplication and one inversion.

| Step | Evaluation | |
|---|---|---|
| 0 | $D = r_{xA} d_3 + r_{xB} d_2$ | (intermediate result) |
|   | $a = r_\Lambda d_3 + r_{xB} d_1$ | (intermediate result) |
| 1 | $b = \begin{cases} ad_2 & \text{if } d_3 \neq 0 \\ ar_{xA} & \text{otherwise} \end{cases}$ | (intermediate result) |
|   | $D^{-1} = (D)^{-1}$ | (D complete) |
| 2 | $a = a(D^{-1})$ | (a complete) |
|   | $b = \begin{cases} d_1 + b(D^{-1}), & \text{if } d_3 \neq 0 \\ r_\Lambda + b(D^{-1}) & \text{otherwise} \end{cases}$ | (intermediate result) |
| 3 | $b = \begin{cases} b(d_3^{-1}) & \text{if } d_3 \neq 0 \\ b(r_{xB}^{-1}) & \text{otherwise} \end{cases}$ | (b complete) |

The number of steps and the particular progression of sub-computations in the table above are exemplary and other variations are contemplated. Additionally, values and variables other than those shown can also be performed by interleaved sub-computations that are arranged in a progressive, step-wise manner.

Referring again to FIG. 9, what have been described thus far are circuits and architectures for implementing a Reed-Solomon list decoder that uses iterative decoding and the validity test. The embodiments of FIGS. 11-16 so far have assumed that the inputs to the respective circuits can be available when needed. In practice, the availability of the input values can depend on a number of factors, such as the communication capabilities of a memory. In some cases, for example, a memory's data bus width may not coincide exactly with the number of input values a circuit may need.

Figure 17:
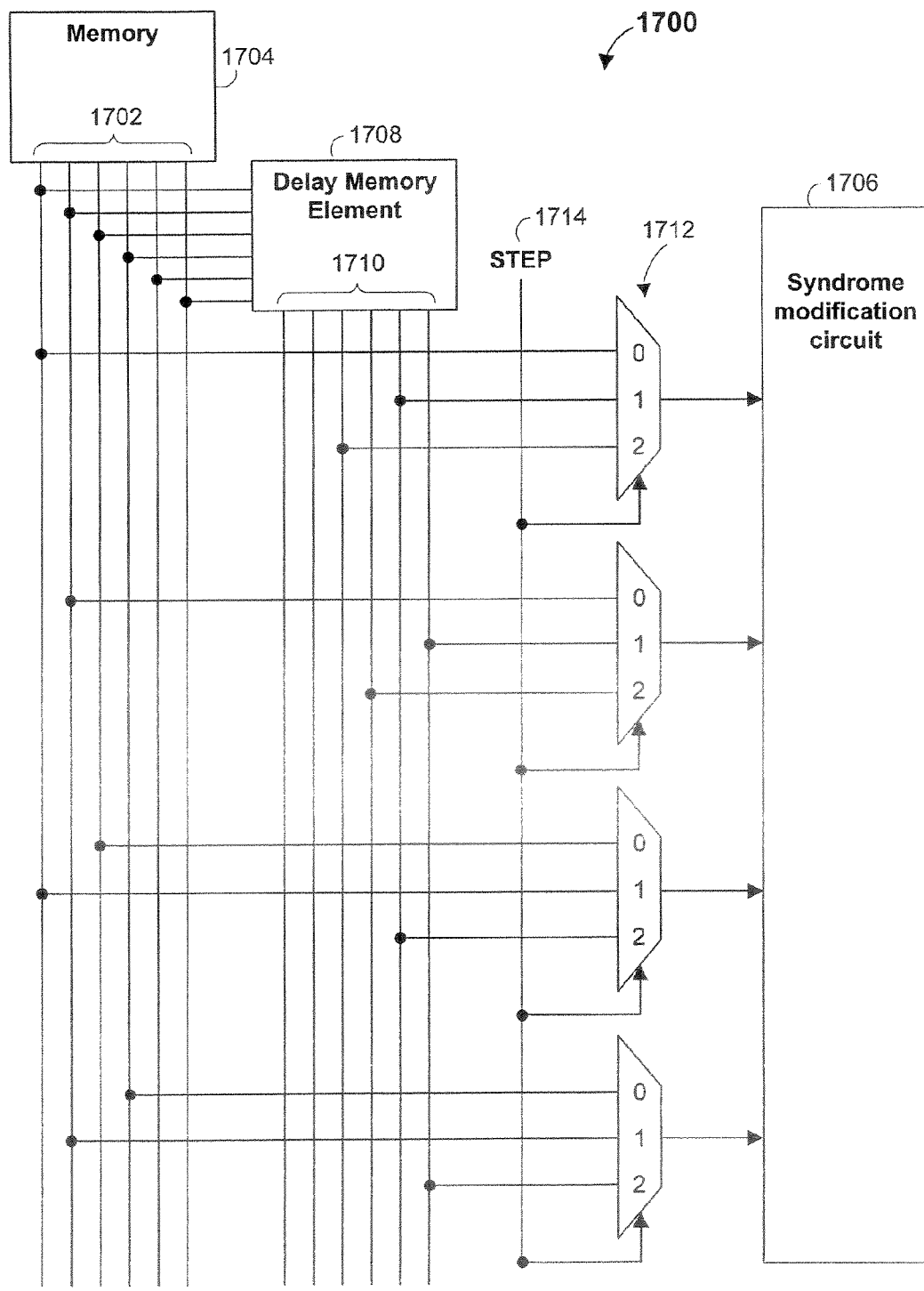
FIG. 17 is a diagram of circuitry for providing input values to a computation circuit, such as a syndrome modification circuit.

In accordance with one aspect of the disclosed invention, delay memory elements may be used to allow the correct input values to be available at the inputs to a circuit. Referring to FIGS. 17-18, FIG. 17 shows a system 1700 for providing inputs to a computation circuit, and FIG. 18 shows the timing and operation of the system of FIG. 17. In the illustrated embodiment, a data bus 1702 for a memory 1704 is able to provide six values at a time. Furthermore, the illustrated computation circuit is a syndrome modification circuit 1706 that can compute four modified syndromes at a time. The memory 1702 can be accessed at regular intervals based on a clock signal (not shown). The data bus 1702 is connected to a delay memory element 1708 that can store the input values and provide them on a second data bus 1710 during the next clock interval. Accordingly, the memory data bus 1702 and the delay memory data bus 1710 together can provide twelve values. Out of these twelve values, the syndrome modification circuit 1706 selects four values per clock interval using four multiplexors 1712. Although the multiplexors 1712 are shown as being external to the syndrome modification circuit 1706, they can also be implemented to be within the circuit 1706. The multiplexors are controlled by a STEP signal 1714, which can assume values zero, one, and two. The STEP signal 1714 can be generated in many ways that will be known to one skilled in the art.

Since the memory 1704 provides six values per access, two memory accesses will provide twelve values. These twelve values will need to be processed over three clock intervals because the syndrome modification circuit 1706 uses only four values per clock interval. Referring to FIG. 18, during an initial clock interval, the memory data bus 1702 provides syndromes $S_0, \ldots, S_5$. These syndromes are stored in the delay memory element 1708 to be provided in the next clock interval. In the initial clock interval, the STEP signal 1714 has a value of "zero", which directs the multiplexors 1712 to select syndromes $S_0, \ldots, S_3$ on the memory data bus 1702 for syndrome modification. In the next clock interval, the memory data bus 1702 provides syndromes $S_6, \ldots, S_{11}$, and the delay memory data bus 1710 provides the stored syndromes $S_0, \ldots, S_5$. In this clock interval, the STEP value of "one" directs the multiplexors 1712 to select the next four syndromes $S_4, \ldots, S_7$. Two of these syndromes are from the delay memory data bus 1708 and two are from the memory data bus 1702. In the third clock interval, there are four syndromes $S_8, \ldots, S_{11}$ remaining to be processed based on the two accesses to the memory 1702, and the memory 1702 is not accessed in this clock interval. The syndromes $S_8, \ldots, S_{11}$ are provided on the delay memory data bus 1710, and the STEP value of "two" directs the multiplexors 1712 to select them. In this manner, the system 1700 of FIG. 17 and the timing of FIG. 18 allow the syndrome modification circuit 1706 to compute four syndromes per clock interval using data buses 1702, 1710 that provide six values each.

The illustrated embodiments of FIGS. 17-18 are exemplary. Variations in the numbers and types of components and their connections and arrangements are contemplated. The timing of memory accesses and the number of delay memory elements can also be varied.

Figure 19:
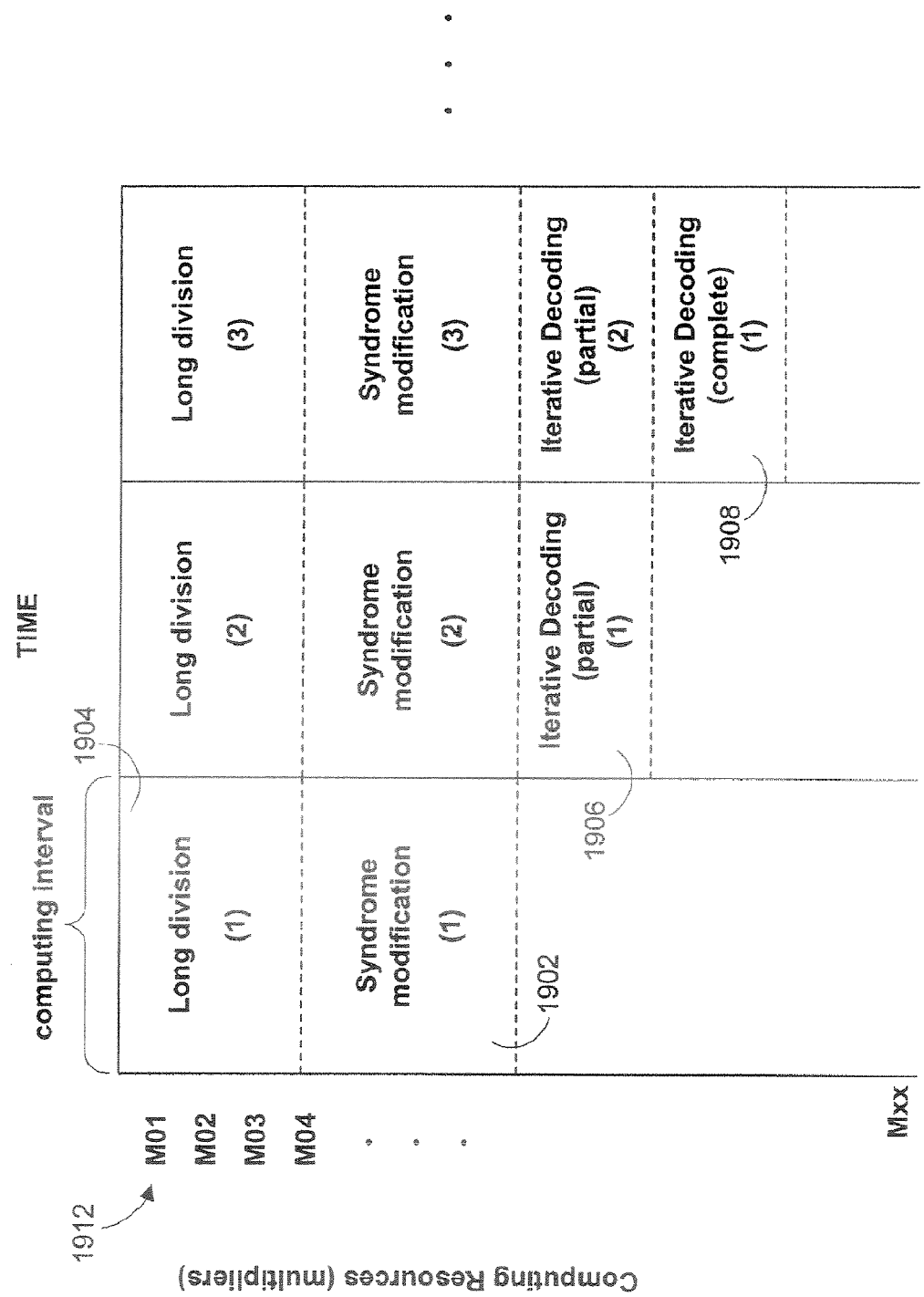
FIG. 19 is a graph of the progression of processing through an exemplary pipelined list decoder.
Figure 20:
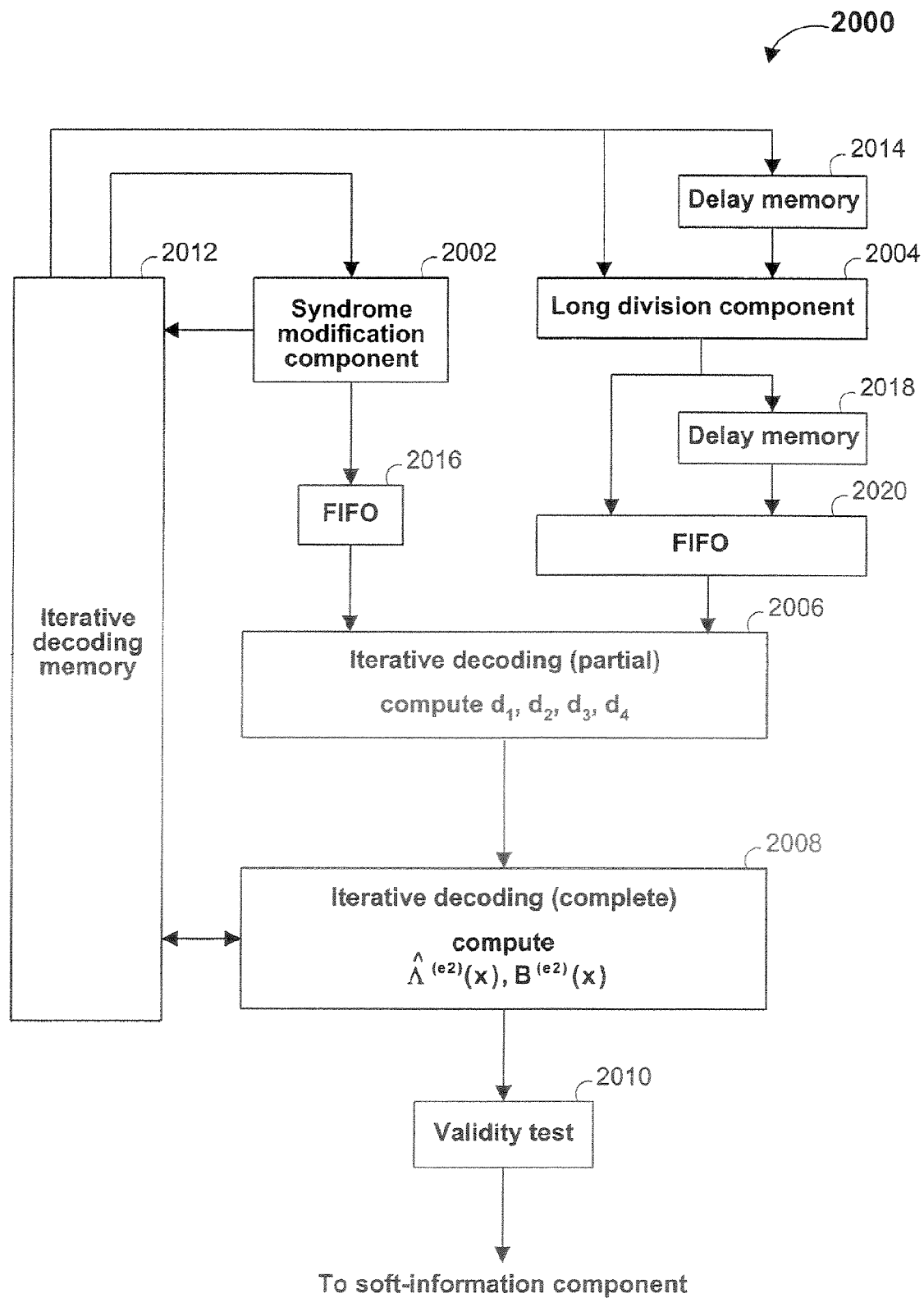
FIG. 20 is a block diagram of the components of an exemplary list decoder in accordance with the pipelined configuration of FIG. 19.

FIGS. 19-20 show one embodiment of a list decoding system in accordance with the systems and methods disclosed herein. FIG. 19 shows a three-stage pipeline timing diagram for a list decoding system. The first stage includes syndrome modification computation 1902 and a long division computation 1904. The second stage includes a partial iterative decoding computation 1906 that computes values $d_1$, $d_2$, $d_3$, and/or $d_4$. The third stage includes the remainder of the iterative decoding computation 1908, which uses the values $d_1$-$d_4$ to compute a new error locator polynomial $\hat{\Lambda}^{(ei)}(x)$ and a new scratch polynomial $B^{(ei)}(x)$. Optionally, the third stage can also include a validity test (not shown). Each stage performs its computations using a particular allocation of resources, such as multipliers Mxx 1912, and over a specified computing interval duration. A computing interval may be equivalent to one or more clock cycles. For example, a computing interval can be equivalent to nine clock cycles. During the nine clock cycles, a long division circuit can, for example, compute four quotient coefficients per clock cycle for a total of thirty-six coefficients over the nine clock cycles.

FIG. 20 shows a block diagram of a list decoder 2000 that operates in accordance with the pipelined configuration of FIG. 19. The list decoder 2000 includes a syndrome modification component 2002, a long division component 2004, a partial iterative decoding component 2006, a second iterative decoding component 2008, a validity test component 2010, and an iterative decoding memory 2012. The illustrated list decoder 2000 includes one delay memory component 2014 between the iterative decoding memory 2012 and the long division component 2004 and another delay memory component 2018 at the output of the long division component 2004.

The outputs of the syndrome modification component can be stored in an addressable memory, such as FIFO memory 2016, and the outputs of the long division component can be stored in another FIFO memory 2020. The number and arrangement of delay memory components in the illustrated list decoder 2000 are exemplary and variations from the illustrated embodiment are contemplated. The components and their connections are also exemplary and variations may include a different number or arrangement of connections without departing from the disclosed technology.

FIGS. 21-22 show one timing implementation for the first pipeline stage of FIGS. 19-20. It is assumed that each computing interval is equivalent to nine clock intervals. Also, the syndrome modification circuit 2002 computes six modified syndromes per clock interval and the long division circuit 2004 computes four quotient coefficients per clock interval.

FIG. 21 is a table showing the timing and progression of syndrome modification computations over a computation interval. For clarity, only the indices of the syndromes and modified syndromes are shown. Assume that t=36 and δ=5 so that the "lower" syndromes are computed over the nine clock intervals. The iterative decoding memory 2012 can provide six syndromes per clock interval, and the syndrome modification component 2002 can compute six modified syndromes per clock interval. Accordingly, no delay memory component is needed for syndrome modification in the illustrated embodiment.

FIG. 22 is a table showing the timing and progression of a long division computation $$Q_\Lambda(x) = \frac{\Lambda(x)}{(x + \alpha^{-j})}$$

over a computation interval. Assume, as before, that t=36, and also assume that the degree of an error locator polynomial $\Lambda(x)$ is less than or equal to t. The first error locator polynomial coefficient $\Lambda_{36}$ can be pre-loaded into the delay memory component 2014 (FIG. 20). The first quotient coefficient $(Q_\Lambda)_{35}$ is equal to $\Lambda_{36}$ and need not be computed. The other quotient coefficients can be computed in groups of four coefficients per clock interval. In each clock interval, the error locator polynomial coefficients that are used in the computations are shown by a darker outline. In the final clock interval, the last value computed is the remainder value $r_\Lambda$. The computation of coefficients for $$Q_B(x) = \frac{B(x)}{(x + \alpha^{-j})}$$

can be performed in the same manner. The computation for coefficients for other quotient polynomials $Q_{x\Lambda}(x)$, $Q_{xB}(x)$, and $Q_{x^2B}(x)$ can be computed based on equations EQ19-EQ24 and can, in one embodiment, be computed as the coefficients for $Q_\Lambda(x)$ and $Q_B(x)$ become available.

Referring again to FIG. 20, the results of the syndrome modification component 2002 and the long division component 2004 can be stored in the FIFO memories 2016, 2018. Since it is assumed that the data connections communicate six data values in parallel and the syndrome modification component 2002 produces six modified syndromes concurrently, the output of the syndrome modification component 2002 can be communicated to the FIFO 2016 without using a delay memory. In contrast, it is assumed that the long division component produces only four quotient coefficients concurrently, rather than six. Therefore, a delay memory 2018 is needed in order to concurrently store six quotient coefficients to the FIFO memory 2020. The FIFO memories 2016,2018 can communicate their stored values to subsequent pipeline stages for computation in a subsequent computation interval. The timing of computations in the second and third pipeline stages can be implemented in accordance with aspects of the disclosed technology. In particular, such computation timings may require use of one or more delay memory elements (not shown) between the FIFO memories 2016,2020 and the partial iterative decoding component 2006, and/or between the partial iterative decoding component 2006 and the second iterative decoding component 2008.

The pipeline configuration of FIG. 19, the list decoder of FIG. 20, and the timing diagrams of FIGS. 21-22 are exemplary. Variations of the illustrated embodiments are contemplated. For example, timing configurations other than those shown in FIGS. 21-22 may require the use of more than one delay memory element. Additionally, although timing diagrams and delay memory elements are not shown for some list decoding operations, such operations can also be timed in accordance with the systems and methods of the disclosed invention.

In one aspect of the disclosed invention, the time required to perform the list decoding operations described herein can be reduced by recognizing that terms of the form $(a^{j_l})^i$ are used several times, where a is a primitive element and $j_l$ is a symbol position corresponding to error event l. In syndrome modification computations, the value of i can range from zero to 2t (assuming that one extra syndrome is available, or $\Delta=1$). In the single syndrome modification circuit of FIG. 11, only the values i=0 and i=1 are needed. However, when a number w of syndrome modification circuits are used in parallel, such as in FIG. 12, then the values i=0, . . . , w are needed. In long division computations, the values of are negative. In the single recursive long division circuit of FIG. 13, only the value i=−1 is needed. However, when a number w of long division circuits are used in parallel, such as in FIG. 14, then values i=−1, −2, . . . , −w are needed.

In one embodiment, the list decoding operation can be improved by pre-computing $(a^{j_l})^i$ for values of i that will be needed, as described above. For example, the pre-computation can produce values of $(a^{j_2})^i$ corresponding to an error event l=2. In one embodiment, values of $(a^{j_l})^i$ can be computed for multiple error events l. For example, in a list of most-likely error events having six error events l=1, . . . , 6, values $(a^{j_l})^i$ can be pre-computed for all or a subset of the six error event.

Accordingly, what have been described are systems and methods for implementing a Reed-Solomon error-correction system. The disclosed circuits, components, and methods can be implemented using means such as digital circuitry, analog circuitry, and/or a processor architecture with programmable instructions. Additionally, components and/or methods that store information or carry signals can operate based on electrical, optical, and/or magnetic technology, and can include devices such as flip-flops, latches, random access memories, read-only memories, CDs, DVDs, disk drives, or other storage or memory means. The disclosed embodiments and illustrations are exemplary and do not limit the scope of the disclosed technology as defined by the following claims.

What is claimed is:

1. A method of generating an updated error indicator in a Reed-Solomon decoder capable of decoding an n-symbol decision-codeword to produce a k-symbol dataword, the method comprising:

receiving existing syndromes $S_0, \ldots, S_{2t-1}$ for a decision-codeword, where t=(n−k)/2;

generating modified syndromes $S_0^{(e_l)}, \ldots, S_{t+\delta}^{(e_l)}$ based on the existing syndromes, where $\delta$ is a positive integer;

receiving existing error indicator polynomials $\Lambda(x)$ and B(x) associated with the decision-codeword; and generating updated error indicator polynomials based on the modified syndromes, wherein said generating comprises:

computing quotient polynomials $Q_\Lambda(x)$, $Q_{x\Lambda}(x)$, $Q_B(x)$, $Q_{xB}(x)$, $Q_{x^2B}(x)$ based on $\Lambda(x)$ and B(x), computing remainder values $r_\Lambda$, $r_{x\Lambda}$, $r_B$, $r_{xB}$, $r_{x^2B}$ based on $\Lambda(x)$ and B(x), and computing at least one of quantities $d_1$, $d_2$, $d_3$, and $d_4$, where $$d_1 = \sum_{i=0} S_{t+\delta-i}^{(e_1)}(Q_\Lambda)_i,$$

$$d_2 = \sum_{i=0} S_{t+\delta-i}^{(e_1)}(Q_{x\Lambda})_i,$$

$$d_3 = \sum_{i=0} S_{t+\delta-i}^{(e_1)}(Q_{xB})_i, \text{ and}$$

$$d_4 = \sum_{i=0} S_{t+\delta-i}^{(e_1)}(Q_{x^2B})_i.$$

2. The method of claim 1, wherein said generating updated error indicator polynomials further comprises:

computing a quantity D=determinant $$\begin{bmatrix} r_{x\Lambda} & r_{xB} \\ d_2 & d_3 \end{bmatrix};$$

computing quantities a, b, and c, where $$a = (r_\Lambda d_3 + r_{xB} d_1)D^{-1},$$

$$b = \begin{cases} (d_1 + ad_2)d_3^{-1} & \text{if } d_3 \neq 0 \\ (r_\Lambda + ar_{x\Lambda})r_{xB}^{-1} & \text{otherwise} \end{cases}; \text{ and}$$

$$c = r_\Lambda r_B^{-1};$$

computing an updated error locator polynomial $\Lambda^{(e_l)}(x)=\Lambda(x)+ax\Lambda(x)+bxB(x)$ if $\deg(\Lambda(x))<\deg(B(x))+2$; and computing an updated scratch polynomial $B^{(e_l)}(x)=\Lambda(x)+cB(x)$ if $\deg(\Lambda(x))<\deg(B(x))+2$.

3. The method of claim 2, further comprising:

computing a quantity $$\Delta = \sum_{i=0}^{v} (S_{v-i}^{(e_l)} \hat{\Lambda}_i^{(e_l)}),$$

where v=deg($\Lambda$(x)); and concluding that $\Lambda^{(e_l)}(x)$ is potentially valid if $\Delta=0$.

4. The method of claim 1, wherein said generating updated error indicator polynomials further comprises:

computing a quantity D=determinant $$\begin{bmatrix} r_{xB} & r_{x^2B} \\ d_3 & d_4 \end{bmatrix} = d_4 * r_{xB} - r_{x^2B} * d_3.;$$

computing quantities a, b, and c, where $$a = (r_\Lambda d_3 + r_{x^2B} d_1) D^{-1},$$

$$b = \begin{cases} (d_1 + ad_3)d_4^{-1} & \text{if } d_4 \neq 0 \\ (r_\Lambda + ar_{xB})r_{xB}^{-1} & \text{if } d_4 = 0 \end{cases}, \text{ and}$$

$$c = r_{xb} r_B^{-1};$$

computing an updated error locator polynomial $\Lambda^{(e_1)}(x) = \Lambda(x) + axB(x) + bx^2B(x)$ if $\deg(\Lambda(x)) \geq \deg(B(x)) + 2$; and computing an updated scratch polynomial $B^{(e_1)}(x) = xB(x) + cB(x)$ if $\deg(\Lambda(x)) \geq \deg(B(x)) + 2$.

5. The method of claim 4, further comprising determining whether errors in the decision-codeword can be completely corrected, including:

computing a quantity $$\Delta = \sum_{i=0}^{v} (S_{v-i}^{(e_l)} \Lambda_i^{(e_l)}),$$

where $v = \deg(\Lambda(x))$; and concluding that $\Lambda^{(e_1)}(x)$ is potentially valid if $\Delta = 0$.

6. The method of claim 1, further comprising:
receiving a clock signal indicating a plurality of clock intervals;
receiving a plurality of dividend coefficients that correspond to an error indicator polynomial for a decision-codeword, wherein the plurality of dividend coefficients include at least a first group of dividend coefficients and a second group of dividend coefficients;
in a first clock interval, computing a first group of quotient coefficients based on the first group of dividend coefficients; and
in a second clock interval, computing a second group of quotient coefficients based on the second group of dividend coefficients and one coefficient from the first group of quotient coefficients.

7. The method of claim 6, wherein the error indicator polynomial is one of: an error locator polynomial and a scratch polynomial.

8. The method of claim 6, wherein the first group of quotient coefficients and the second group of coefficients correspond to dividing the error indicator polynomial by a first degree polynomial of the form $(x + a^{-j})$, where $a^{-j}$ is a constant value.

9. The method of claim 8, wherein:
the first group of dividend coefficients are $p_0, p_1, \ldots, p_m$ where $m \geq 1$; and
the first group of quotient coefficients are $q_0, q_1, \ldots, q_m$, where:

$$q_k = \sum_{i=0}^{k} (p_i \alpha^{-(k-i)j}), k = 0, 1, \ldots, m.$$

10. The method of claim 9, wherein:
the second group of dividend coefficients are $p_{m+1}, p_{m+2}, \ldots, p_{2m}$; and
the second group of quotient coefficients are $q_{m+1}, q_{m+2}, \ldots, q_{2m}$,
where:

$$q_k = q_m \alpha^{-(k-m)j} + \sum_{i=m+1}^{k} (p_i \alpha^{-(k-i)j}), k = m+1, \ldots, 2m.$$

* * * * *